(12) United States Patent
Lee et al.

(10) Patent No.: US 10,340,158 B2
(45) Date of Patent: Jul. 2, 2019

(54) SUBSTRATE CLEANING APPARATUS

(71) Applicant: SAMSUNG ELECTRONICS CO., LTD., Suwon-si (KR)

(72) Inventors: Eun-Seok Lee, Hwaseong-si (KR); Chang-Gil Ryu, Yongin-si (KR); Geun-Young Song, Suwon-si (KR); Jae-Chang Lee, Hwaseong-si (KR); Yun-Seok Choi, Hwaseong-si (KR); Jin-Suk Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 636 days.

(21) Appl. No.: 15/058,277

(22) Filed: Mar. 2, 2016

(65) Prior Publication Data

US 2016/0329219 A1  Nov. 10, 2016

(30) Foreign Application Priority Data

May 6, 2015 (KR) ........................ 10-2015-0063157

(51) Int. Cl.
| | |
|---|---|
| *H01L 21/67* | (2006.01) |
| *B08B 3/10* | (2006.01) |
| *B08B 1/04* | (2006.01) |
| *B08B 3/02* | (2006.01) |
| *B05B 1/20* | (2006.01) |
| *B05B 13/04* | (2006.01) |
| *B08B 1/00* | (2006.01) |

(52) U.S. Cl.
CPC .......... *H01L 21/67046* (2013.01); *B05B 1/20* (2013.01); *B05B 13/0415* (2013.01); *B08B 1/04* (2013.01); *B08B 3/024* (2013.01); *B08B 3/10* (2013.01); *H01L 21/67051* (2013.01); *H01L 21/67057* (2013.01); *B08B 1/002* (2013.01)

(58) Field of Classification Search
CPC .... H01L 21/304; H01L 21/67; H01L 21/6704
See application file for complete search history.

(56) References Cited

U.S. PATENT DOCUMENTS

| | | | |
|---|---|---|---|
| 6,151,744 A | 11/2000 | Ohtani et al. | |
| 6,254,688 B1 | 7/2001 | Kobayashi et al. | |
| 6,269,511 B1 * | 8/2001 | Andreas | B08B 1/02 |
| | | | 134/902 |

(Continued)

FOREIGN PATENT DOCUMENTS

KR    10-2014-0137754 A    12/2014

*Primary Examiner* — Michael D Jennings
(74) *Attorney, Agent, or Firm* — Sughrue Mion, PLLC

(57) ABSTRACT

Provided is a substrate cleaning apparatus including: a cleaning bath configured to accommodate a substrate having a first surface and a second surface; a substrate support configured to support the substrate; first and second nozzle bars provided in the cleaning bath to be rotatable in a plane parallel with the substrate, each of the first and the second nozzle bars including a passage; a plurality of nozzles provided along a longitudinal direction of each of the first and the second nozzle bars and configured to spray the cleaning solution from the passage of each of the first and the second nozzle bars to the substrate; and first and second brushes, the first brush provided on a first side of the substrate and configured to clean the first surface and the second brush provided on a second side of the substrate and configured to clean the second surface of the substrate.

20 Claims, 21 Drawing Sheets

(56) References Cited

U.S. PATENT DOCUMENTS

| | | | |
|---|---|---|---|
| 6,385,805 B2* | 5/2002 | Konishi | B08B 1/04 134/902 |
| 6,523,553 B1 | 2/2003 | Redeker et al. | |
| 6,558,471 B2 | 5/2003 | Brown et al. | |
| 6,588,043 B1* | 7/2003 | Frost | H01L 21/67034 15/77 |
| 6,598,255 B1 | 7/2003 | Gohda et al. | |
| 6,733,596 B1 | 5/2004 | Mikhaylichenko et al. | |
| 6,986,185 B2 | 1/2006 | Sugarman et al. | |
| 8,533,895 B2 | 9/2013 | Benson | |
| 8,555,458 B2 | 10/2013 | Kawaguchi et al. | |
| 2002/0121289 A1* | 9/2002 | Brown | B08B 3/02 134/6 |
| 2003/0061675 A1* | 4/2003 | Sugarman | B08B 1/04 15/77 |
| 2010/0212100 A1 | 8/2010 | Ku et al. | |
| 2011/0265816 A1* | 11/2011 | Chen | H01L 21/67051 134/6 |
| 2014/0230170 A1 | 8/2014 | Patel | |

\* cited by examiner

SUBSTRATE CLEANING APPARATUS

CROSS-REFERENCE TO RELATED APPLICATION

This application claims priority from Korean Patent Application No. 10-2015-0063157, filed on May 6, 2015 in the Korean Intellectual Property Office (KIPO), the disclosure of which is incorporated herein by reference in its entirety.

BACKGROUND

1. Field

Apparatuses consistent with exemplary embodiments relate to a substrate cleaning apparatus. More particularly, exemplary embodiments relate to a substrate cleaning apparatus which cleans a wafer after performing a chemical mechanical polishing (CMP) process.

2. Description of the Related Art

A chemical mechanical polishing (CMP) process is a semiconductor manufacturing process that may use a chemical solution including slurry and a polishing pad in a manner such that a chemical reaction is induced on a wafer and a mechanical force is transmitted to the wafer so as to planarize a surface of the wafer.

A cleaning process may be performed to remove residues or organic pollutants generated on the wafer surface after performing the CMP process. A substrate cleaning apparatus for performing the cleaning process may include a pair of brushes slidably contacting both surfaces of the wafer to clean the wafer and a plurality of spray nozzles spraying a cleaning solution at both surfaces of the wafer.

In a wafer cleaning apparatus of the related art, a spray nozzle sprays a cleaning solution with a fixed spraying angle at a fixed position, and thus the cleaning solution may be sprayed out at a fixed range, thereby causing loss of the wafer due to a cleaning failure. Further, before a new brush is installed in the wafer cleaning apparatus, an aging process may be required to be performed in a separate aging apparatus, and thus a cleaning process time may be increased, thereby lowering productivity.

SUMMARY

Exemplary embodiments provide a substrate cleaning apparatus capable of improving efficiency and productivity of a cleaning process.

According to aspect of an exemplary embodiment, there is provided a substrate cleaning apparatus including a cleaning bath providing a cleaning space for receiving a substrate, a substrate support adapted to support the substrate in the cleaning bath, a pair of nozzle bars installed in the cleaning bath to be rotatable in a plane parallel with the substrate and including a passage therein through which a cleaning solution flows, a plurality of nozzles provided along a longitudinal direction of the nozzle bar and be in fluid communication with the passage to spray the cleaning solution to the substrate, and a pair of brushes movable in both sides of the substrate and adapted to be in a slidable contact with both surfaces of the substrate to clean the substrate.

In exemplary embodiments, the substrate may be positioned between planes in which the nozzle bars move respectively.

In exemplary embodiments, the nozzle bar may rotate about a portion of a longitudinal axis of the nozzle bar between a first position parallel with a vertical direction and a second position parallel with a horizontal direction in the cleaning bath.

In exemplary embodiments, the substrate cleaning apparatus may further include a connection bar connected to end portions of the nozzle bars and having a connection passage in fluid communication with the passages of the nozzle bars, and a head portion configured to rotate the connection bar about a longitudinal axis of the connection bar and supply the cleaning solution to the connection passage.

In exemplary embodiments, the nozzle bar may extend from a side of the connection bar in a direction perpendicular to the longitudinal axis of the connection bar.

In exemplary embodiments, the head portion may include a drive shaft fixed to the connection bar to rotate with the connection bar and a drive shaft driving unit adapted to the rotate the drive shaft on its own axis.

In exemplary embodiments, the head portion may further include a rotary union adapted to flow the cleaning solution into a fluid passage formed through the drive shaft.

In exemplary embodiments, the head portion may further include an outer connection tube in fluid communication with the connection passage in the connection bar to supply the cleaning solution.

In exemplary embodiments, the nozzle bar may rotate about its longitudinal axis to adjust a spraying angle of the nozzle.

In exemplary embodiments, the substrate support may include a plurality of rollers which support and rotate the substrate.

In exemplary embodiments, the substrate cleaning apparatus may further include an aging plate disposed in the cleaning bath and adapted to be in contact with the brush to age cleaning nodules of the brush.

In exemplary embodiments, the aging plate may further include a plurality of aging protrusions on a surface of the aging plate.

In exemplary embodiments, a distance between the adjacent aging protrusions may be in a range of from 0.1 to 0.5 of a width of the cleaning nodule of the brush.

In exemplary embodiments, the aging plate may further include a flow guide pathway between the aging protrusions which extend in a direction parallel with the vertical direction of the cleaning bath.

In exemplary embodiments, the aging plate may be installed in an inner wall of the cleaning bath.

In exemplary embodiments, the substrate cleaning apparatus may further include a gas exhaust portion for exhausting a gas from the cleaning bath to the outside.

According to an aspect of another exemplary embodiment, there is provided a substrate cleaning apparatus including a cleaning bath providing a cleaning space for receiving a substrate in a vertical direction, a substrate support adapted to support the substrate in the vertical direction in the cleaning bath, a spraying unit adapted to spray a cleaning solution at both surfaces of the substrate in the cleaning bath, a pair of brushes movable in a horizontal direction in both sides of the substrate and adapted to be in a slidable contact with both surfaces of the substrate to clean the substrate, and an aging plate disposed in the cleaning bath and adapted to be in contact with the brush to age cleaning nodules of the brush.

In exemplary embodiments, the spraying unit may include a pair of nozzle bars adapted to be rotatable in planes parallel with the substrate respectively and including a passage therein through which a cleaning solution flows, and a plurality of nozzles provided along a longitudinal direction of the nozzle bar and be in fluid communication with the passage to spray the cleaning solution to the substrate.

In exemplary embodiments, the substrate may be positioned between planes in which the nozzle bars move respectively.

In exemplary embodiments, the nozzle bar may rotate about an end portion of the nozzle bar between a first position parallel with the vertical direction and a second position parallel with the horizontal direction.

In exemplary embodiments, the substrate cleaning apparatus may further include a connection bar connected to the end portions of the nozzle bars and having a connection passage in fluid communication with the passages of the nozzle bars, and a head portion configured to rotate the connection bar about a longitudinal axis of the connection bar and supply the cleaning solution to the connection passage.

In exemplary embodiments, the nozzle bar may extend from a side of the connection bar in a direction perpendicular to the longitudinal axis of the connection bar.

In exemplary embodiments, the head portion may include a drive shaft fixed to the connection bar to rotate with the connection bar and a drive shaft driving unit adapted to the rotate the drive shaft on its own axis.

In exemplary embodiments, the head portion may further include a rotary union adapted to flow the cleaning solution into a fluid passage formed through the drive shaft.

In exemplary embodiments, the head portion may further include an outer connection tube in fluid communication with the connection passage in the connection bar to supply the cleaning solution.

In exemplary embodiments, the nozzle bar may rotate about its longitudinal axis to adjust a spraying angle of the nozzle.

In exemplary embodiments, the aging plate may further include a plurality of aging protrusions on a surface of the aging plate.

In exemplary embodiments, a distance between the adjacent aging protrusions may be in a range of from 0.1 to 0.5 of a width of the cleaning nodule of the brush.

In exemplary embodiments, a height of the aging protrusion may be in a range of from 0.5 to 0.05 of a height of the cleaning nodule of the brush.

In exemplary embodiments, the aging plate may further include a flow guide pathway between the aging protrusions which extend in a direction parallel with the vertical direction of the cleaning bath.

In exemplary embodiments, the aging plate may be installed in an inner wall of the cleaning bath.

In exemplary embodiments, the substrate cleaning apparatus may further include a gas exhaust portion for exhausting a gas from the cleaning bath to the outside.

According to an aspect of another exemplary embodiment, there is provided a substrate cleaning apparatus, including: a cleaning bath comprising a cleaning space configured to accommodate a substrate having a first surface and a second surface opposite to the first surface; a substrate support configured to support the substrate in the cleaning bath; first and second nozzle bars provided in the cleaning bath to be rotatable in a plane parallel with the substrate, each of the first and the second nozzle bars including a passage through which a cleaning solution flows; a plurality of nozzles provided along a longitudinal direction of each of the first and the second nozzle bars and configured to spray the cleaning solution from the passage of each of the first and the second nozzle bars to the substrate; and first and second brushes, the first brush provided on a first side of the substrate and configured to clean the first surface and the second brush provided on a second side opposite to the first side of the substrate and configured to clean the second surface of the substrate.

The first brush may be configured to slidably move toward or away from the substrate, and the second brush may be configured to slidably move toward or away from the substrate.

The substrate may be provided between the first and the second nozzle bars.

Each nozzle bar of the first and the second nozzle bars may be configured to rotate about a respective end portion of each nozzle bar between a first position on the plane and a second position on the plane, each nozzle bar extending in a first direction at the first position and each nozzle bar extending in a second direction perpendicular to the first direction in the cleaning bath.

The substrate cleaning apparatus may further include: a connection bar connected to an end portion of each nozzle bar and comprising a connection passage connected to with the passages of the first and the second nozzle bars; and a head portion configured to rotate the connection bar about a longitudinal axis of the connection bar and to supply the cleaning solution to the connection passage.

Each nozzle bar may extend from a side of the connection bar in a direction perpendicular to the longitudinal axis of the connection bar.

The head portion may include: a drive shaft fixed to the connection bar to rotate with the connection bar; and a drive shaft driving unit configured to the rotate the drive shaft on its own axis.

The head portion may further include a rotary union configured to guide the cleaning solution to flow into a fluid passage formed through the drive shaft.

The head portion may further include an outer connection tube connected to the connection passage in the connection bar and configured to supply the cleaning solution.

Each nozzle bar of the first and the second nozzle bars may be configured to rotate about a longitudinal axis of the respective nozzle bar to adjust a spraying angle of the nozzle.

The substrate support may include a plurality of rollers configured to support and to rotate the substrate.

The substrate cleaning apparatus may further include an aging plate provided in the cleaning bath and configured to age cleaning nodules of the brush.

The aging plate may include a plurality of aging protrusions provided on the aging plate.

A distance between the adjacent aging protrusions may be in a range of from 0.1 to 0.5 of a width of the cleaning nodule of the brush.

The aging plate may further include a flow guide pathway provided between the aging protrusions which extend in a direction parallel with the vertical direction of the cleaning bath.

The aging plate may be provided on an inner wall of the cleaning bath.

The substrate cleaning apparatus may further include a gas exhaust portion configured to exhaust a gas generated from the cleaning bath to an exterior of the substrate cleaning apparatus.

According to an aspect of another exemplary embodiment, there is provided a substrate cleaning apparatus including: a cleaning bath comprising a cleaning space configured to accommodate a substrate in a first direction; a substrate support configured to support the substrate in the first direction in the cleaning bath; a spraying unit configured to spray a cleaning solution at first and second surfaces of the substrate in the cleaning bath; a pair of brushes movable in a second direction perpendicular to the first direction with respect to the substrate and configured to clean the first and the second surfaces of the substrate via contact; and an aging plate provided in the cleaning bath and configured to age cleaning nodules of the brush.

The spraying unit may include: a pair of nozzle bars configured to be rotatable in planes parallel with the substrate, each of the pair of nozzle bars comprising a passage through which a cleaning solution flows; and a plurality of nozzles provided along a longitudinal direction of each of the nozzle bars and configured to be in communication with the passage to spray the cleaning solution to the substrate.

The substrate may be positioned between the pair of nozzle bars.

A nozzle bar of the pair of nozzle bars may be configured to rotate about an end portion of the nozzle bar between a first position on the plane and a second position on the plane, each nozzle bar extending in a first direction at the first position and each nozzle bar extending in a second direction perpendicular to the first direction in the cleaning bath.

A height of the aging protrusions may be a range from 0.5 mm to 2 mm and a height of the cleaning nodule may be in a range from 3 mm to 10 mm.

The aging plate may further include a flow guide pathway provided between the aging protrusions which extend in a direction parallel with the vertical direction of the cleaning bath.

According to an aspect of another exemplary embodiment, there is provided a substrate cleaning apparatus including: a cleaning bath configured to accommodate a substrate having a first surface and a second surface opposite to the first surface, the cleaning bath comprising a first sidewall and a second sidewall provided opposite to the first side wall; a substrate support configured to support the substrate in the cleaning bath; a first nozzle bar provided between the first sidewall and the first surface and configured to be rotatable in a first plane extending parallel with the substrate; a second nozzle bar provided between the second sidewall and the second surface and configured to be rotatable in a second plane extending parallel with the substrate, each of the first and the second nozzle bars comprising: a passage through which a cleaning solution flows; and a plurality of nozzles provided along a longitudinal direction of each of the first and the second nozzle bars and configured to spray the cleaning solution from the passage of each of the first and the second nozzle bars to the substrate; and a first brush configured to move between the first side wall and the first surface and to contact clean the first surface; and a second brush configured to move between the second side wall and the second surface and contact clean the second surface.

The first nozzle bar may be configured to spray the cleaning solution on the first surface, and the second nozzle bar may be configured to spray the cleaning solution on the second surface.

The first nozzle bar may be configured to be rotatable about a longitudinal axis of the first nozzle bar, and the second nozzle bar may be configured to be rotatable about a longitudinal axis of the second nozzle bar.

The first and the second sidewalls may extend in a parallel direction with the substrate.

According to example embodiments, a substrate cleaning process may include a pair of brushes rotatable on its own axis and adapted to be in a slidable contact with both surfaces of a wafer, a spraying unit including a pair of nozzle bars adapted to rotate, sweep or move in planes parallel with the wafer with the wafer interposed therebetween and nozzles provided in the nozzle bars respectively to spray a cleaning solution to both surfaces of the wafer, and an aging unit configured to perform an aging process on cleaning nodules of the brush.

Accordingly, a contact brush cleaning process and a non-contact cleaning process may be selectively performed to remove particles generated on the wafer surface after performing the CMP process. Further, prior to a wafer cleaning process, an aging process may be performed on cleaning nodules of a newly installed brush to thereby improve efficiency and productivity of the following wafer cleaning process.

BRIEF DESCRIPTION OF THE DRAWINGS

Exemplary embodiments of the disclosure will be more clearly understood from the following detailed description taken in conjunction with the accompanying drawings. FIGS. 1 to 19B represent non-limiting, exemplary embodiments as described herein.

FIG. 1 is a cross-sectional view illustrating a substrate cleaning apparatus in accordance with an exemplary embodiment.

FIG. 2 is a side view illustrating the substrate cleaning apparatus in FIG. 1.

FIG. 3 is a perspective view illustrating a spraying unit of the substrate cleaning apparatus in FIG. 1.

FIG. 4 is a perspective view illustrating a pair of nozzle bars of the spraying unit in FIG. 3.

FIG. 5 is a cross-sectional view illustrating a head portion of the spraying unit in FIG. 3.

FIG. 6 is a block diagram illustrating a cleaning solution supply unit connected to the head portion of FIG. 5.

FIG. 7 is a perspective view illustrating a head portion of the spraying unit in FIG. 3 in accordance with an exemplary embodiment.

FIG. 8 is a perspective view illustrating a brush aging unit and a gas discharging unit of the substrate cleaning apparatus in FIG. 1.

FIG. 9 is a cross-sectional view illustrating cleaning nodules of a brush which is processed by an aging plate in FIG. 8.

FIG. 11 is a cross-sectional view illustrating a substrate cleaning apparatus which performs an aging process on a brush.

FIG. 12 is a perspective view illustrating a portion of the substrate cleaning apparatus in FIG. 11.

FIG. 13 is a cross-sectional view illustrating the substrate cleaning apparatus which performs a contact brush cleaning process.

FIG. 14 is a perspective view illustrating a portion of the substrate cleaning apparatus in FIG. 13.

FIG. 15 is a cross-sectional view illustrating the substrate cleaning apparatus which performs a non-contact brush cleaning process.

FIG. 16 is a perspective view illustrating a portion of the substrate cleaning apparatus in FIG. 15.

FIGS. 17 to 19B are side views illustrating movements of a nozzle bar of the substrate cleaning apparatus in FIG. 15.

DETAILED DESCRIPTION OF EXEMPLARY EMBODIMENTS

Figure 1:
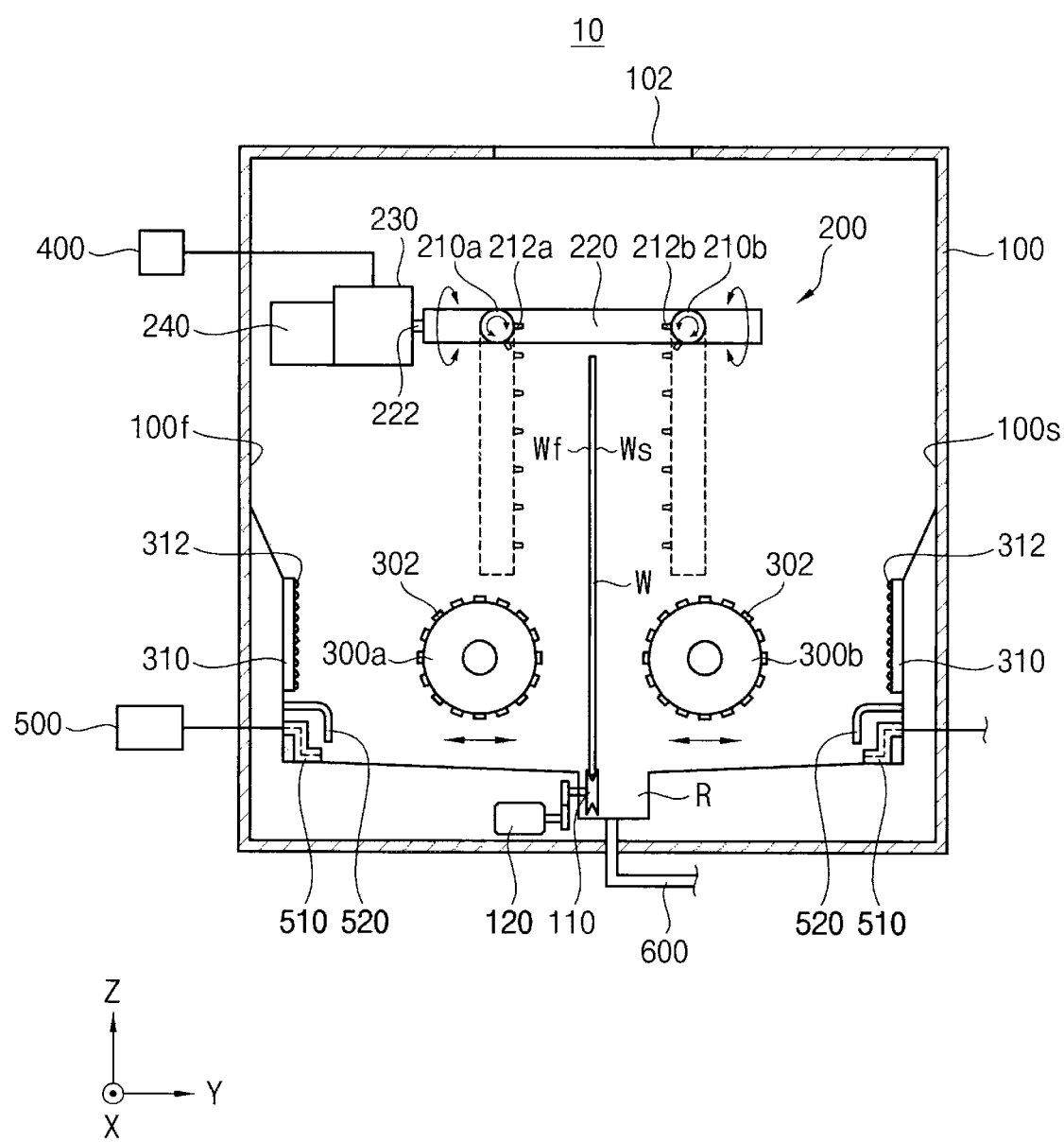

Various example embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough and complete, and will fully convey the scope of exemplary embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
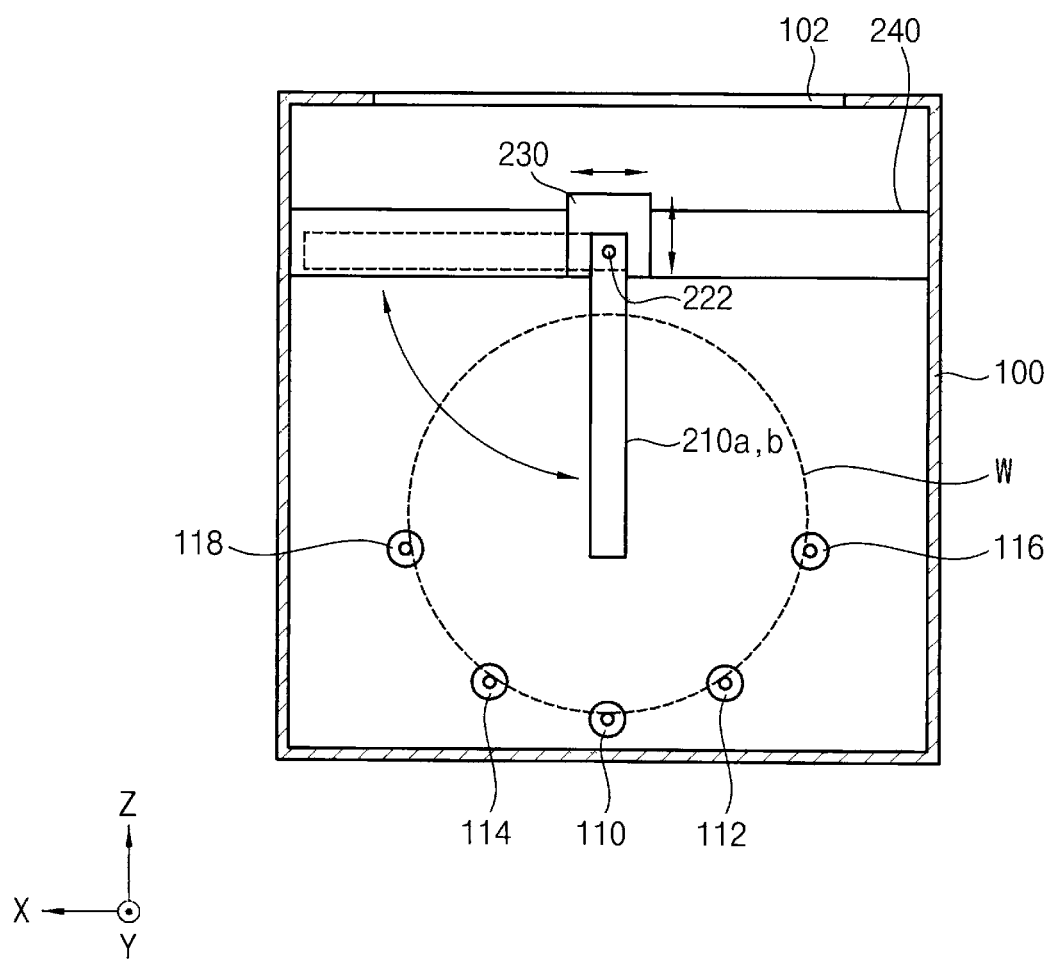
Figure 3:
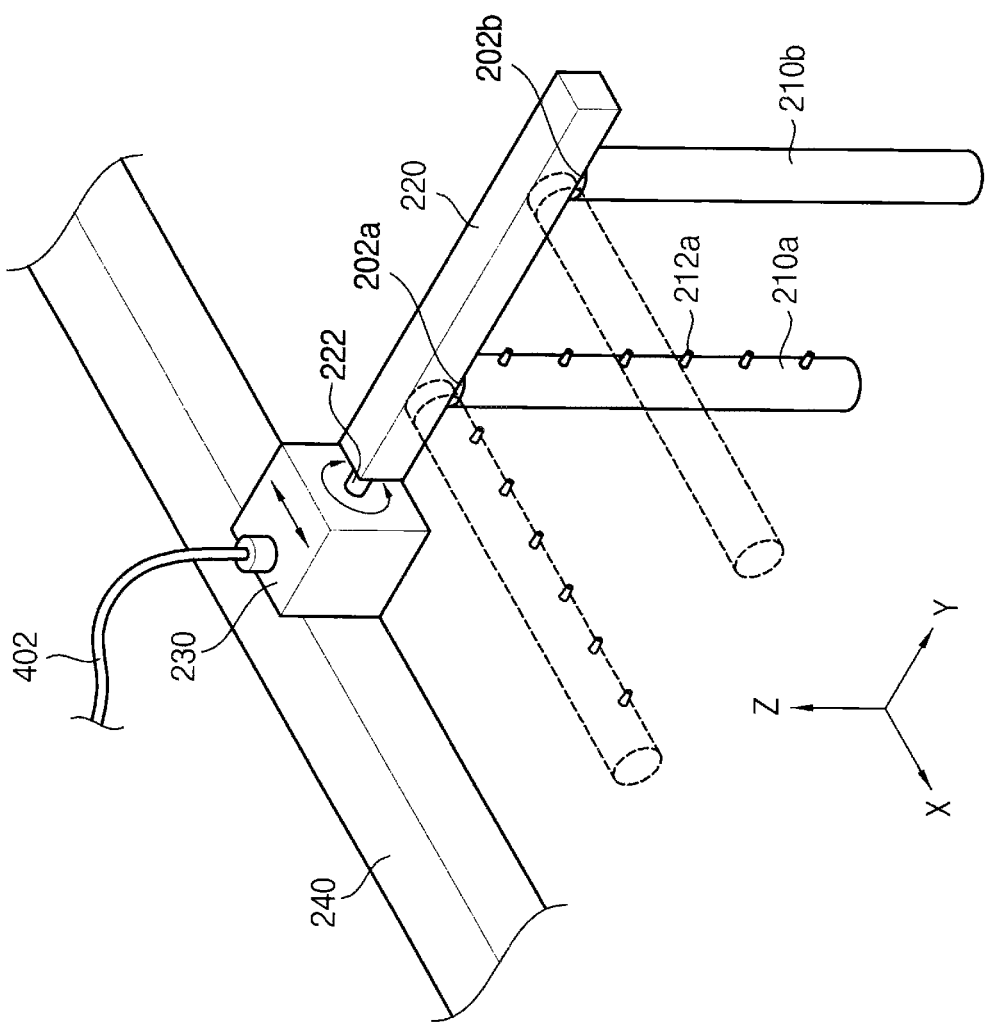
Figure 4:
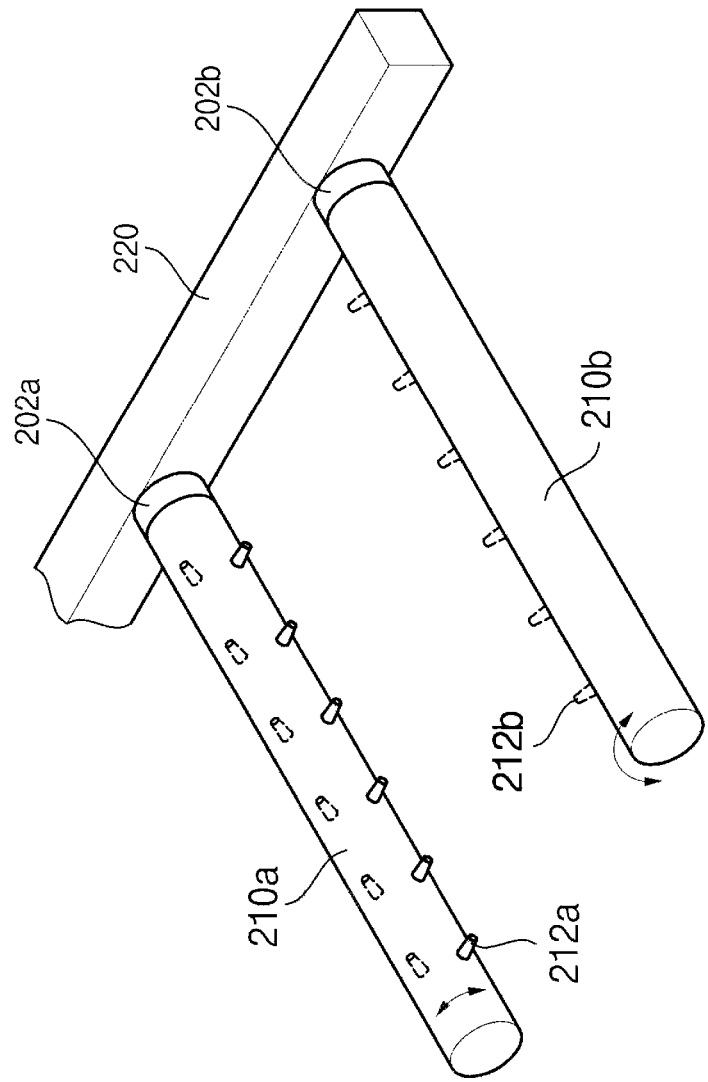
Figure 5:
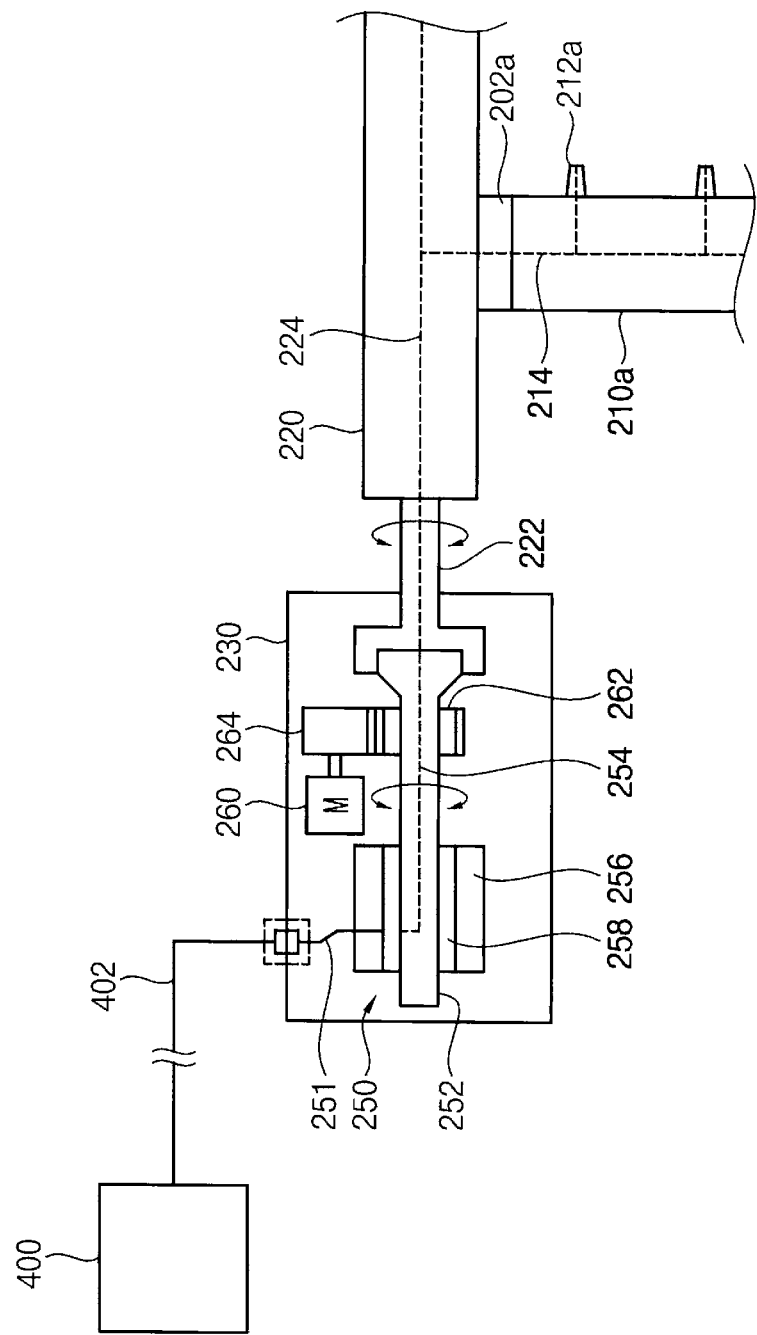
Figure 6:
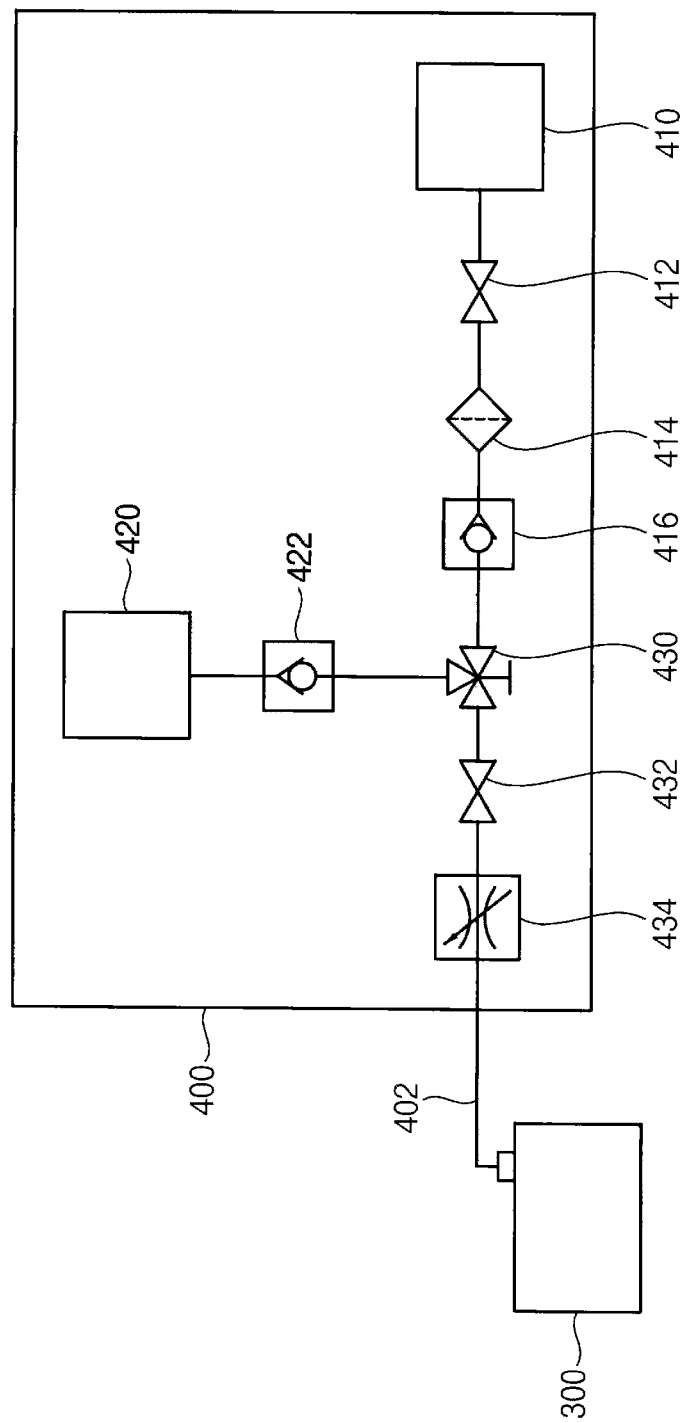
Figure 7:
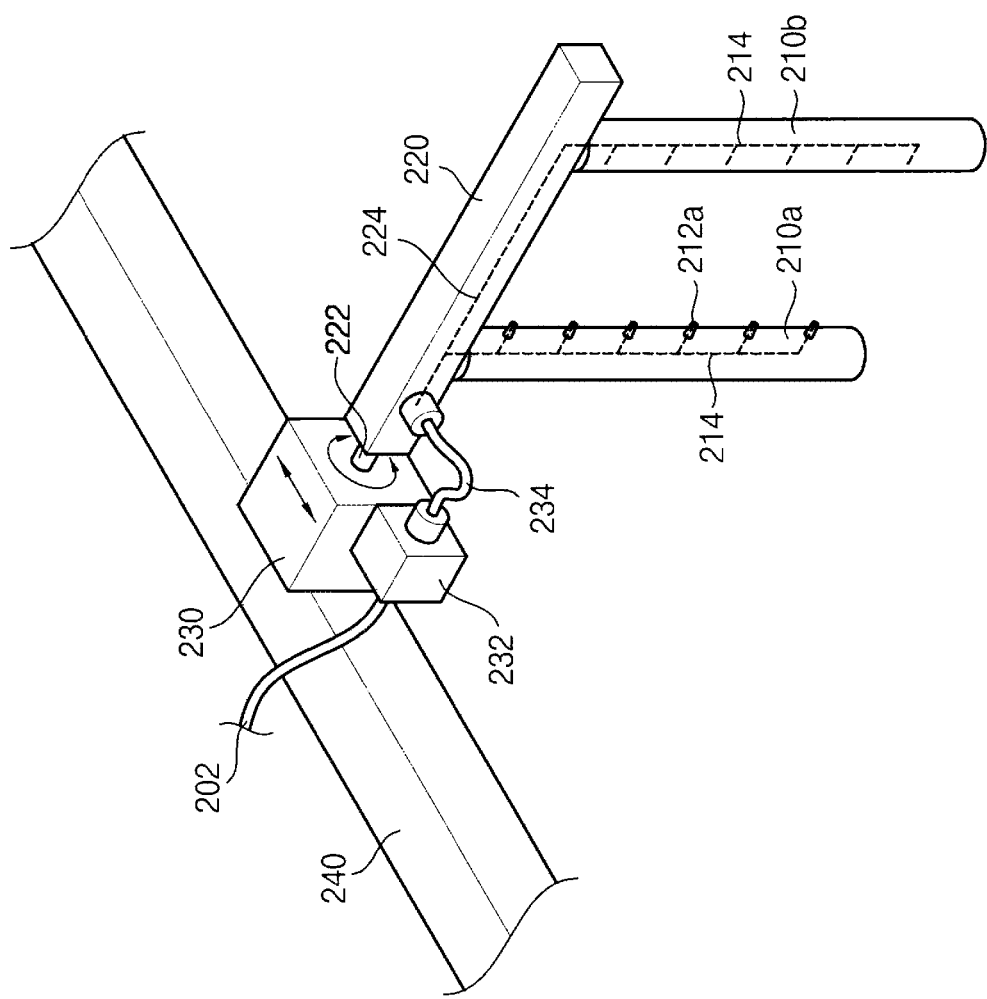
Figure 8:
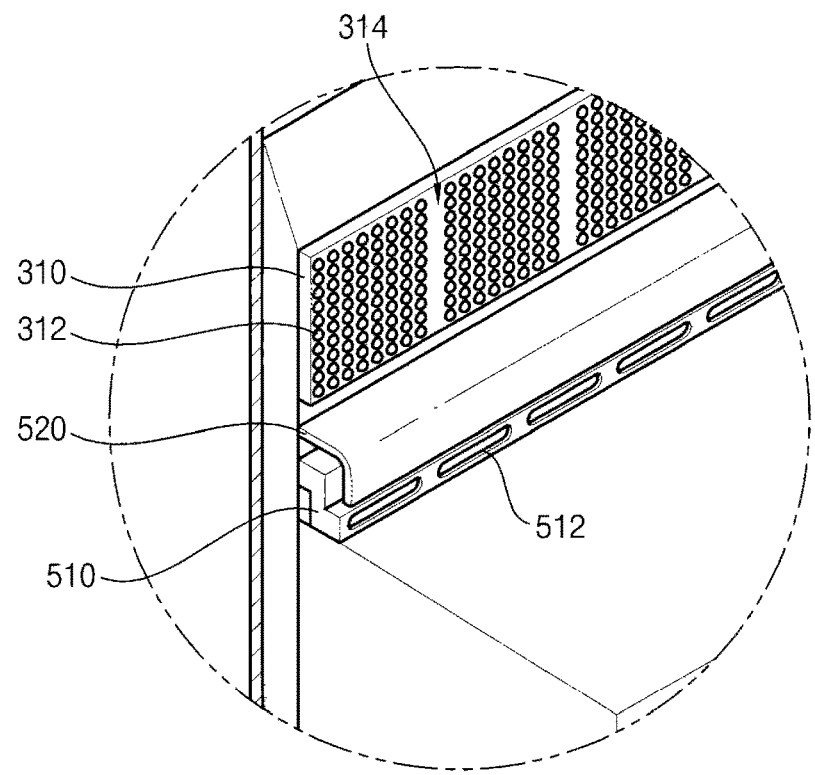
Figure 9:
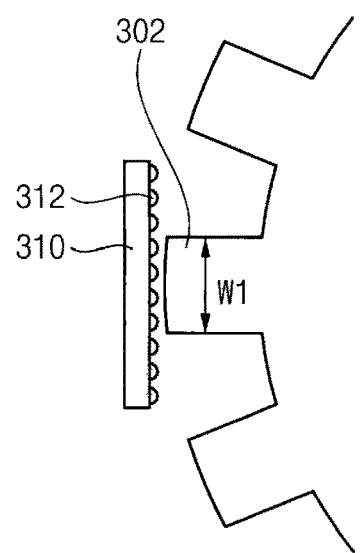
Figure 10A:
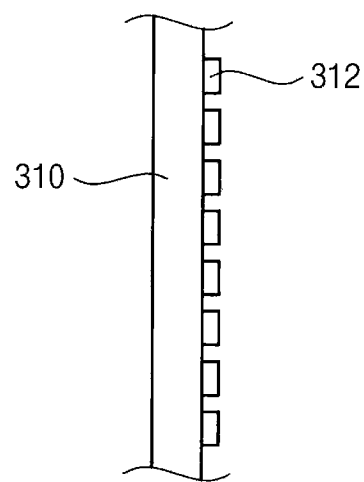
FIGS. 10A to 10E are cross-sectional views illustrating aging protrusions of an aging plate in accordance with an exemplary embodiment.
Figure 10B:
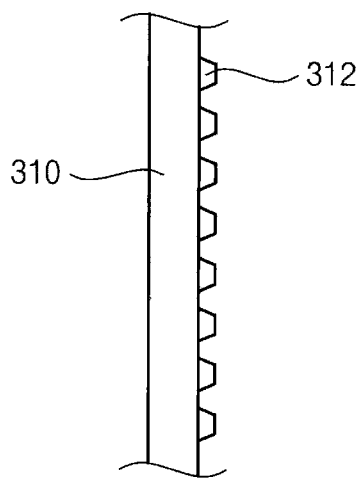
Figure 10C:
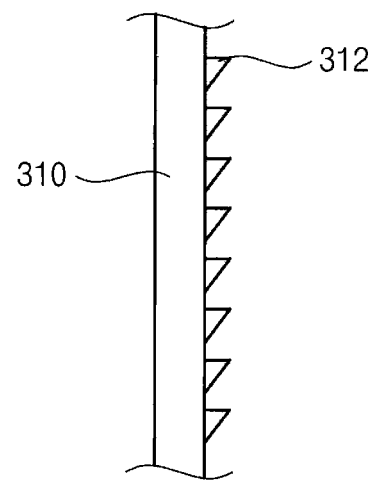
Figure 10D:
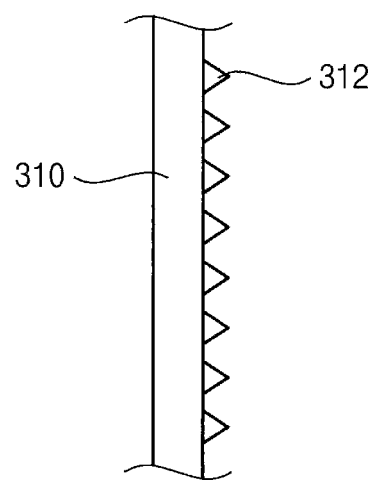
Figure 10E:
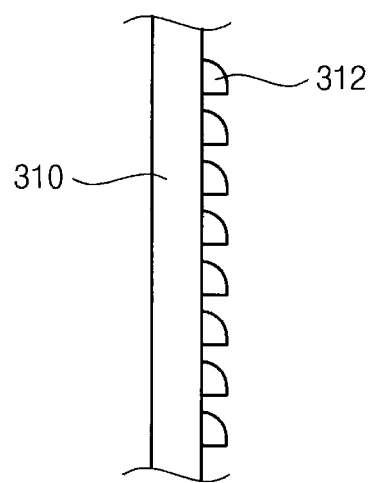

FIG. 1 is a cross-sectional view illustrating a substrate cleaning apparatus 10 in accordance with an exemplary embodiment. FIG. 2 is a side view illustrating the substrate cleaning apparatus 10 in FIG. 1. FIG. 3 is a perspective view illustrating a spraying unit of the substrate cleaning apparatus in FIG. 1. FIG. 4 is a perspective view illustrating a pair of nozzle bars of the spraying unit 200 in FIG. 3. FIG. 5 is a cross-sectional view illustrating a head portion 230 of the spraying unit 200 in FIG. 3. FIG. 6 is a block diagram illustrating a fluid supply unit 400 connected to the head portion of FIG. 5. FIG. 7 is a perspective view illustrating the head portion 230 of the spraying unit 200 in FIG. 3 in accordance with an exemplary embodiment. FIG. 8 is a perspective view illustrating a brush aging unit and a gas exhaust portion of the substrate cleaning apparatus in FIG. 1. FIG. 9 is a cross-sectional view illustrating cleaning nodules 302 of a brush 300a, 300b which is processed by an aging plate 310 in FIG. 8.

Referring to FIGS. 1 to 9, a substrate cleaning apparatus 10 may include a cleaning bath 100, a substrate support including a plurality of rollers 110, 112, 114, 116 and 118 adapted to support and to rotate a substrate, a spraying unit 200 adapted to spray a cleaning solution at a surface of the substrate, a brush unit having a brush 300a, 300b for scrubbing the surface of the substrate to remove particles on the surface thereof, and a brush aging unit including at least one aging plate 310 adapted to perform an aging process on a plurality of cleaning nodules 302 of the brush 300a, 300b.

In the exemplary embodiments, the cleaning bath 100 may provide a cleaning space S for receiving the substrate. For exemplary, the substrate may include a wafer W. A gate 102 may be provided in an upper portion of the cleaning bath 100 to allow the wafer W to be transferred from/to the cleaning bath 100.

Specifically, in manufacturing of semiconductor devices, a chemical mechanical polishing (CMP) process may be performed to form a desired pattern on the wafer W. After performing the CMP process, a cleaning process may be performed to remove residues or organic pollutants generated on the wafer surface. A wafer transfer mechanism, e.g., wafer handler (not illustrated) may load the wafer W into the cleaning bath 100 through the gate 102 and then, the wafer transfer mechanism may unload the wafer W on which a cleaning process has been performed through the gate 102.

In the exemplary embodiment, the substrate support including a plurality of rollers 110, 112, 114, 116 and 118 may support the wafer W in a vertical direction (XZ direction). The substrate support including a plurality of rollers 110, 112, 114, 116 and 118 may support the wafer W in the vertical direction and rotate the wafer W. At least one roller, for example, a roller 110, may be connected to a roller driving mechanism 120. In the exemplary embodiment, the roller driving mechanism 120 may include a motor, and a drive shaft of the motor may be connected to the roller 110 through a power transmission mechanism, e.g., gear or pulley, to rotate the roller 110. As the roller 110 rotates by the roller driving mechanism 120, the wafer W may rotate while being supported by the rollers 110, 112, 114, 116 and 118.

The substrate support may further include a guide (not illustrated), which extends from the roller to contact and guide the wafer W. The guide may increase a contact area with the wafer W to thereby more securely support the wafer W. At least one hole may be formed through a lower portion of the guide. Accordingly, the cleaning solution which flows into the guide may be discharged outside through the hole.

In exemplary embodiments, the spraying unit including a pair of nozzle bars 210a and 210b may supply the cleaning solution to the surface or both surfaces of the wafer W in the cleaning bath 100. The spraying unit may be adapted to be rotatable in planes parallel with the surface of the wafer W respectively, and a plurality of nozzles 212a and 212b respectively arranged along longitudinal directions of each of the nozzle bars 210a and 210b.

The nozzle bars 210a and 210b may provide a path through which a cleaning solution for cleaning the wafer W flows. A passage 214 of each nozzle bar through which the cleaning solution flows may be formed in each of the nozzle bars 210a and 210b, and the plurality of nozzles 212a and 212b of each nozzle bar formed through sides of the nozzle bars 210a and 210b may be in communication with the passages 214.

The spraying unit including the pair of nozzle bars 210a and 210b may further supply a gas to the surface or both surfaces of the wafer W in the cleaning bath 100. The spraying unit may further include a plurality of gas nozzles (not illustrated) respectively arranged along the longitudinal directions of the nozzle bars 210a and 210b. The gas nozzle may have a structure the same as or similar to the nozzles 212a and 212b which discharge the cleaning solution. For example, a gas passage through which the gas flows may be formed in each of the nozzle bars 210a and 210b, and the gas nozzles respectively formed through the sides of each of the nozzle bars 210a and 210b may be in communication with the gas passages respectively.

Alternatively, the spraying unit may selectively or simultaneously supply the cleaning solution and the gas through the nozzles 212a and 212b formed in the nozzle bars 210a and 210b.

In exemplary embodiment, each of the nozzle bars 210a and 210b may be installed to rotate a portion of a full rotation about a longitudinal axis of a bar to which each of the nozzle bars 210a and 210b is attached to. As illustrated in FIGS. 2 and 3, the nozzle bar may be installed to be rotatable about an end portion thereof.

In particular, the spraying unit may further include a connection bar 220 connected to an end portion of each of the nozzle bars 210a and 210b and a head portion 230 configured to rotate the connection bar 220 about a longitudinal axis of the connection bar 220.

Accordingly, when the wafer W is supported by the rollers 110, 112, 114, 116 and 118 of the substrate support, a pair of the nozzle bars 210a and 210b may pivot about the longitudinal axis of the connection bar 220 such that the nozzle bars 210a and 210b move (sweep) in the planes parallel with the surface of the wafer W with the wafer W interposed between the nozzle bars 210a and 210b. For example, each of the nozzle bars 210a and 210b may sweep about the end portion of each of the nozzle bars 210a and 210b between a first position parallel with a vertical direction (−Z direction) and a second position parallel with a horizontal direction (+X direction) as shown in FIG. 2.

Further, the nozzle bars 210a and 210b may be installed to be movable in the horizontal direction (X direction) or the vertical direction (Z direction). The head portion 230 may be installed to be movable in the X direction or Z direction along a transfer guide 240. As the head portion 230 moves along the transfer guide 240, the nozzle bars 210a and 210b may move in the X direction or the Z direction.

As illustrated in FIG. 5, the head portion 230 may include a drive shaft 252 fixed to a driven shaft 222 of the connection bar 220 to rotate with the connection bar 220 and a drive shaft driving unit adapted to the rotate the drive shaft 252 on its own axis. The drive shaft driving unit may include a driving motor 260.

A connection passage 224 may be formed in the connection bar 220 to be in fluid communication with the passages 214 of the nozzle bars 210a and 210b. The head portion 230 may supply a cleaning solution from a fluid supply unit 400 to the connection passage 224 of the connection bar 220. Thus, the cleaning solution may be supplied to the passages 214 in the nozzle bars 210a and 210b and then may be sprayed out from the nozzles 212a and 212b.

In exemplary embodiments, the head portion 230 may further include a rotary union 250 adapted to flow the cleaning solution into a fluid passage 254 formed through the drive shaft 252 in a sealed-up state.

The rotary union 250 may include the drive shaft 252 having at least one fluid passage 254 formed therein and a seal housing 256 surrounding the drive shaft 252. The drive shaft 252 may extend through and be supported by the seal housing 256, and be rotatable on its own axis within the seal housing 256. The seal housing 256 may include at least one through-hole formed therein which is connected to the fluid passage 254.

The drive shaft 252 may be connected to the driving motor 260 of the drive shaft driving unit to rotate on its own axis. For example, a driven gear 262 may be installed in a portion of the drive shaft 252, and the driving motor 260 may rotate a driving gear 264, which is engaged with the driven gear in the drive shaft 252, to rotate the drive shaft 252. The drive shaft driving unit may be installed in a lower portion of the drive shaft 252. However, it may not be limited thereto, and the drive shaft driving unit may be installed in an upper portion of the drive shaft 252.

A stack sealing part 258 may be interposed between the drive shaft 252 and the seal housing 256. The stack sealing part 258 may prevent a leakage of fluid from the drive shaft 252 rotating at a given speed. The stack sealing part 258 may include a rotary ring serving as a metal portion which rotates together with the drive shaft 252, and a fixation ring configured such that the seal housing 256 closely adheres to the rotary ring and thus performs a sliding movement. A plurality of the rotary rings and a plurality of the fixation rings may be stacked alternately on each other to form the stack sealing part. Accordingly, the stack sealing part 258 may connect the fluid passage 254 of the drive shaft 252 to the through-hole of the seal housing 220 in a sealed-up state, when the drive shaft 252 rotates within the seal housing 256.

The rotary union 250 may be connected to the fluid supply unit 400 through a fluid tube 251. The fluid tube 251 may be connected to the through-hole of the seal housing 256 such that a cleaning solution is supplied from the fluid supply unit 400 through the fluid tube 251 to the fluid passage 254 of the drive shaft 252. Accordingly, as described below, a cleaning solution and/gas may be supplied from the fluid supply unit 400 into the connection passage 224 of the connection bar 220 through the head portion 230, and then, may be sprayed on the wafer W through the nozzles 212a and 212b and/or the gas nozzles.

The head portion 230, the connection bar 220, the nozzle bars 210a and 210b and the nozzles 212a and 212b may include a material having excellent chemical resistance and thermal endurance, e.g., plastic or stainless steel. The nozzles 212a and 212b may include a spray hole having various shapes, e.g., spray type shape or conical type shape. The nozzles may be arranged linearly along the longitudinal direction of the nozzle bar. The number of the nozzles, a distance between adjacent nozzles, etc may be determined in consideration of a cleaning process conditions.

As illustrated in FIG. 6, the fluid supply unit 400 may be connected to the head portion 230 via a fluid supply line 402 to selectively supply a first cleaning solution and a second cleaning solution different from each other. The fluid supply unit 400 may include a first cleaning solution supply portion 410 for supplying the first cleaning solution and a second cleaning solution supply portion 420 for supplying the second cleaning solution.

For example, the first cleaning solution may include a cleaning fluid such as dilute $NH_4OH$ or HF, and the second cleaning solution may include a cleaning fluid such as DIW. The first cleaning solution from the first cleaning supply portion 410 and the second cleaning solution from the second cleaning supply portion 420 may be selectively supplied to the head portion 230 through a 3-way control valve 430.

A first valve 412, a filter 414 and a first check valve 416 may be installed in a first supply line between the first cleaning supply portion 410 and the 3-way control valve 430. A second check valve 422 may be installed in a second supply line between the second cleaning supply portion 420 and the 3-way control valve 430. A second valve 432 and a regulator 434 may be installed in the fluid supply line 402 between the 3-way control valve 430 and the head portion 230. Flow sensors may be installed in the fluid supply line 402, the first supply line and the second supply line, respectively to control the supply of the first cleaning solution and the second cleaning solution.

Although it is not illustrated in the figure, the fluid supply unit 400 may further include a gas supply portion for supplying a gas. The gas from the gas supply portion may be supplied to the head portion 230 through the fluid supply line, and then, may be supplied to the gas nozzles through the fluid passage in the drive shaft 252 of the rotary union 250, the connection passage in the connection bar 220 and the gas passages in the nozzle bars 210a and 210b. Accordingly, the gas supplied from the gas supply portion through the head portion 230 may be sprayed at the wafer W through the gas nozzles.

As illustrated in FIG. 4, each of the nozzle bars 210a and 210b may be installed to rotate about respective longitudinal axis of the nozzle bars 210a and 210b in order to adjust a spraying angle of the nozzle. The spraying angle may be the angle between the surface of the wafer W and an ejection direction of the fluid spraying from the nozzle 212a, 212b. The nozzle bars 210a and 210b may be connected to the connection bar 220 by a nozzle bar rotating mechanism 202a, 202b such that the nozzle bar is rotated by a predetermined angle on its own axis.

Accordingly, as the nozzle bars 210a and 210b rotate, the nozzles 212a and 212b rotate together to thereby control the spraying angle of the cleaning solution. The spraying angle of the nozzle may be adjusted according to a cleaning process time to thereby improving wafer edge uniformity.

As illustrated in FIG. 7, in exemplary embodiments, the head portion 230 may include a rotation drive portion for rotating the connection bar 220 and a fluid transfer portion for transferring a fluid such as the cleaning solution to the connection passage 224 in the connection bar 224.

The rotation drive portion may include a drive shaft fixed to the connection bar 220 to rotate with the connection bar 220 and a drive shaft driving unit adapted to the rotate the drive shaft on its own axis. The drive shaft may be connected to a driving motor of the drive shaft driving unit to rotate on its own axis. A driven gear may be installed in a portion of the drive shaft, and the driving motor may rotate a driving gear, which is engaged with the driven gear in the drive shaft, to rotate the drive shaft. Thus, the connection bar 220 may be rotated about a longitudinal axis of the connection bar 220 by the drive shaft.

The fluid transfer portion may include a transfer block 232 (FIG. 7) connected to the fluid supply unit 400 by the fluid supply line 402 and an outer connection tube 234 connecting the transfer block 232 and the connection bar 220. The outer connection tube 234 may be in fluid communication with the connection passage 224 in the connection bar 220. Accordingly, the cleaning solution and/or gas from the fluid supply unit may be transferred through the transfer block 232 and the outer connection tube 234 to the connection passage 224 of the connection bar 220, and then, may be sprayed at the wafer W through the nozzles 212a and 212b and/or gas nozzles.

In the exemplary embodiment, the brush unit may include a pair of brushes 300a and 300b for scrubbing both surfaces of the wafer W supported by the substrate support including a plurality of rollers and a brush driving portions 304a and 304b (See FIG. 14) for moving and rotating the brushes 300a and 300b.

Figure 14:
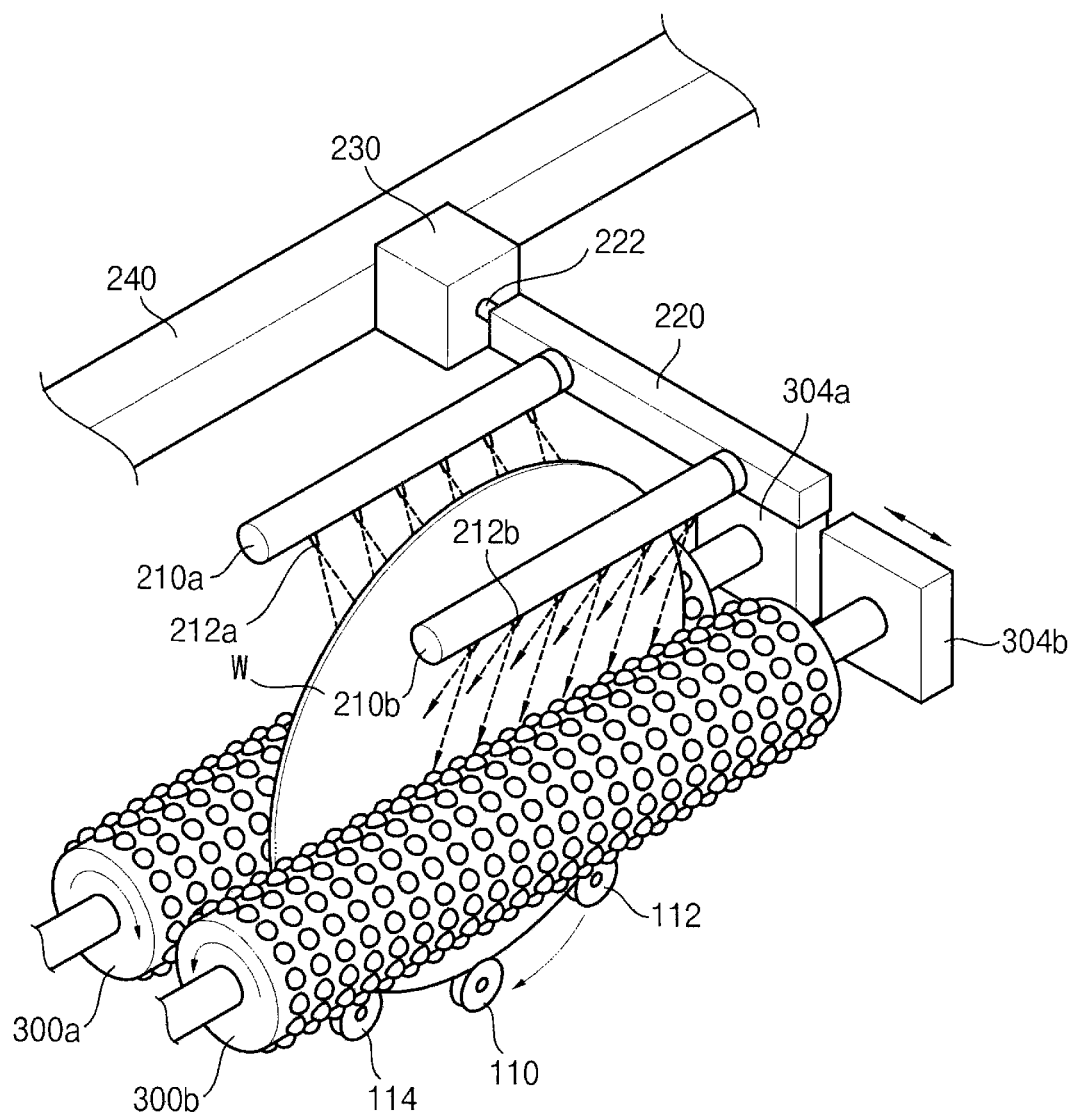

Each of the brushes 300a and 300b may be installed in either side of the wafer W supported by the rollers in a lower portion of the cleaning bath 100. That is, a first brush 300a is provided on a first side of the wafer W and a second brush 300b is provided on a second side opposite to the first side of the wafer W as shown in FIG. 14. Each of the brushes 300a and 300b may be mounted on an outer circumferential surface of a brush core as a rotating shaft. A plurality of the cleaning nodules 302 may be formed on an outer circumferential surface of the brush 300a, 300b. As the brush core rotates, the cleaning nodules 302 may slidably contact the surface of the wafer W to clean the wafer W. The brush 300a, 300b may include polymeric compound. Examples of the polymeric compound may be Polyvinyl Alcohol (PVA), Paraformadehyde (PFA), etc.

The brushes 300a and 300b may rotate in opposite directions while slidably contacting both surfaces of the wafer W. For example, a first brush 300a may rotate in a clockwise direction and a second brush 300b may rotate in a counterclockwise direction.

The brushes 300a and 300b may move towards or away from each other while the wafer W is interposed between the brushes 300a and 300b. For example, the first brush 300a may move reciprocally between a first surface $W_f$ of the wafer W and a first sidewall $100_f$ of the cleaning bath 100, and the second brush 300b may move reciprocally between a second surface $W_s$ of the wafer W opposed to the first surface and a second sidewall $100_s$ of the cleaning bath opposite to the first sidewall.

In an exemplary embodiment, the brush aging unit may include at least one aging plate 310 disposed in the cleaning bath 100 to contact the cleaning nodules 302 of the brush 300a, 300b for an aging process on the cleaning nodules 302.

The aging plate 310 may be installed in each of the first and second sidewalls $100_f$, $100_s$ of the cleaning bath 100. For example, the aging plate 310 may be detachably adhered to the first or second sidewall of the cleaning bath 100. A plurality of aging protrusions 312 may be formed on a surface of the aging plate 310.

The aging plate 310 having the aging protrusions 312 may include quarts or polymer material having a higher hardness than the brush. Examples of the polymer material of the aging plate 310 may be Polypropylene (PP), Polyethylene (PE), Polyphenylene Sulfide (PPS), Polyether ether ketone (PEEK), Polytetrafluoroethylene (PTFE), etc. However, the types of material of the aging plate are not particularly limited.

After a new brush is installed in the substrate cleaning apparatus 10, before performing a cleaning process on a wafer, an aging process may be required to be performed on cleaning nodules of the new brush.

For example, before a wafer W is loaded into the cleaning bath 100 in order for a cleaning process, new brushes 300a and 300b may move to the first and second sidewalls of the cleaning bath 100 respectively to contact the aging plate 310 and then rotate on respective rotational axis of the brushes 300a, 300b such that an angled corner of a cleaning nodule 302 may be aged into a round shape.

As illustrated in FIG. 8, the aging plate 310 may further include a flow guide pathway 314 between the aging protrusions 312 in order to easily drain a fluid from the aging plate 310. The flow guide pathway 314 may extend in a direction parallel with the vertical direction (−Z direction as shown in FIG. 1) between the aging protrusions 312. The fluid such as the cleaning solution sprayed out during the aging process or the cleaning process may be drained easily through the flow guide pathway 314 and therefore may be prevented from remaining on the aging plate 310.

As illustrated in FIG. 9, a distance between the adjacent aging protrusions 312 of the aging plate 310 (for example, a distance from peak to peak) may be in a range of from 0.1 to 0.5 of a width (W1) of the cleaning nodule 302.

For example, the width (W1) of the cleaning nodule 302 may range from 1 mm to 10 mm, and a height of the cleaning nodule 302 may range from 3 mm to 10 mm. A width of the aging protrusion 312 may range from 0.01 mm to 2 mm, and a height of the aging protrusion 312 may range from 0.01 mm to 2 mm. However, it may not be limited thereto, and the widths and the heights of the cleaning nodule and the aging protrusion may be determined in consideration of the material, the aging process conditions, etc.

FIGS. 10A to 10E are cross-sectional views illustrating aging protrusions 312 of an aging plate 310 in accordance with exemplary embodiments.

Referring to FIGS. 10A to 10E, aging protrusions 312 having various shapes may be formed on a surface of an aging plate 310. The aging protrusions 312 may have a sectional shape of rectangle, trapezoid, right-angle triangle, isosceles triangle, fan shape, etc. However, it may be understood that the shape of the aging protrusion may not be limited thereto.

As illustrated in FIGS. 1 and 8, in the exemplary embodiments, the substrate cleaning apparatus 10 may further include a gas exhaust portion for exhausting a gas from the cleaning bath 100 to the outside. The gas exhaust portion may include a suction block 510 installed within the cleaning bath 100 to suck a gas and an exhaust pump 500 connected to the suction block 510 to exhaust the gas to the outside.

The suction block 510 may be disposed adjacent to an inner lower wall of the cleaning bath 100. A pair of the suction blocks 510 may be disposed in opposite inner walls of the cleaning bath 100 respectively. The suction block 510 may be arranged under the aging plate 310. A plurality of suction slits 512 (FIG. 8) may be formed along a longitudinal direction of the suction block 510. The gas within the cleaning bath 100 may be sucked through the suction slits 512 into the suction block 510.

A cover 520 may be arranged above the suction block 510. The cover 520 may protect the suction block 510 such that the fluid such as the cleaning solution may be prevented from falling onto the suction block 510. The exhaust pump 500 may include a hydraulic pump connected to the suction block 510 to exhaust the gas from the suction block 510. Accordingly, only fume may be sucked through the suction slits 512 to be exhausted to the outside, not the cleaning solution.

Further, a recess R may be formed in a bottom of the cleaning bath 100. The cleaning solution sprayed out during the cleaning process may be collected in the recess R. An exhaust line 600 may be connected to the recess R. The cleaning solution collected in the recess R may be exhausted to the outside.

Thus, the gas generated during the cleaning process may be exhausted through the gas exhaust portion to the outside, and the cleaning solution sprayed out during the cleaning process may be exhausted through the exhaust line 600 to the outside.

Hereinafter, a method of cleaning a wafer W using the substrate cleaning apparatus 10 in FIG. 1 will be explained.

Figure 11:
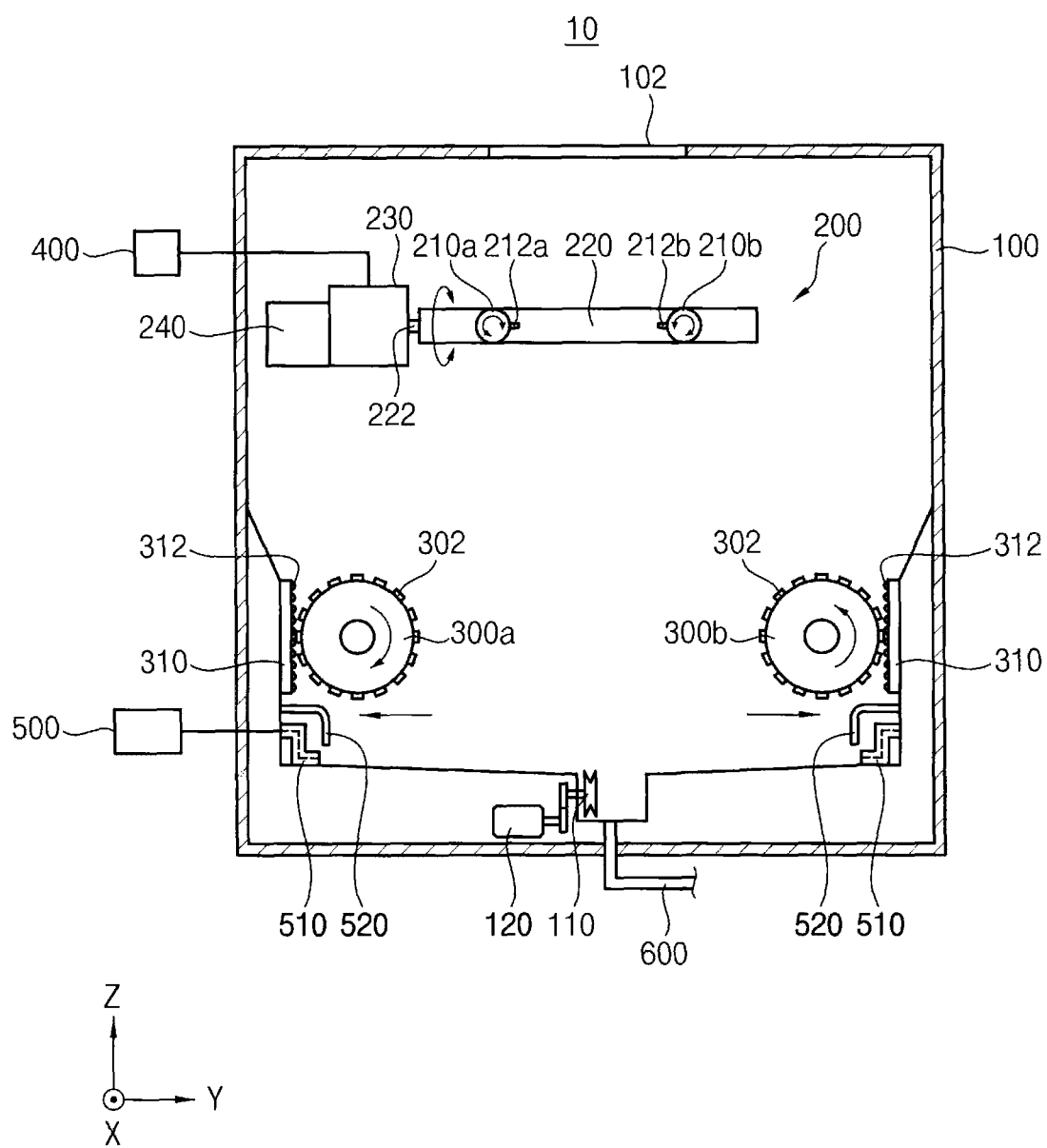
Figure 12:
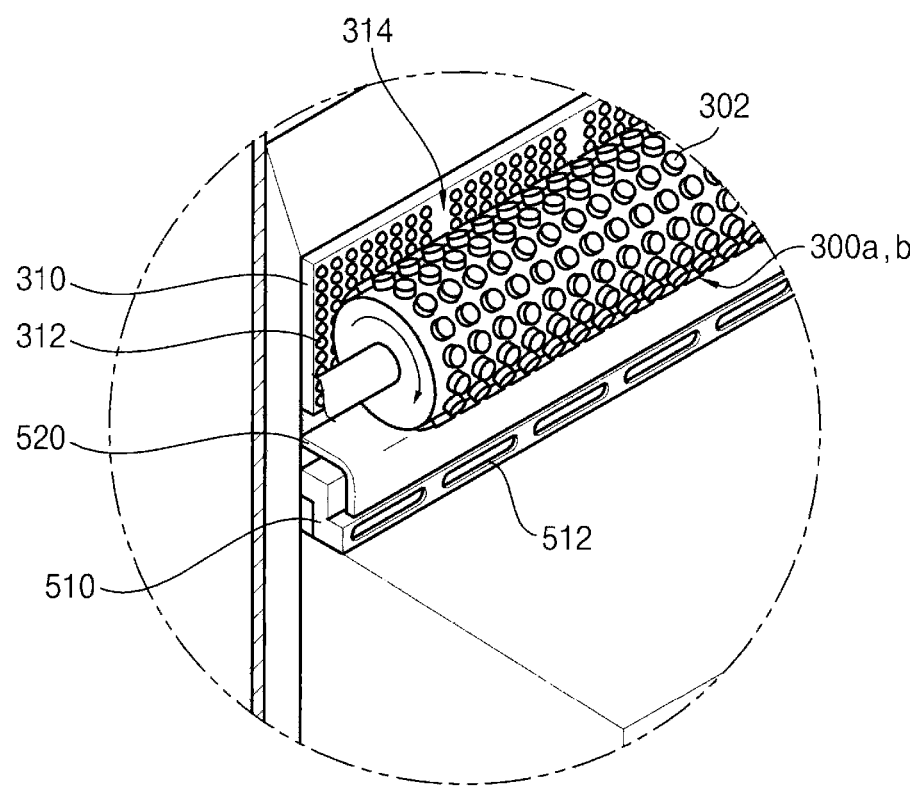
Figure 13:
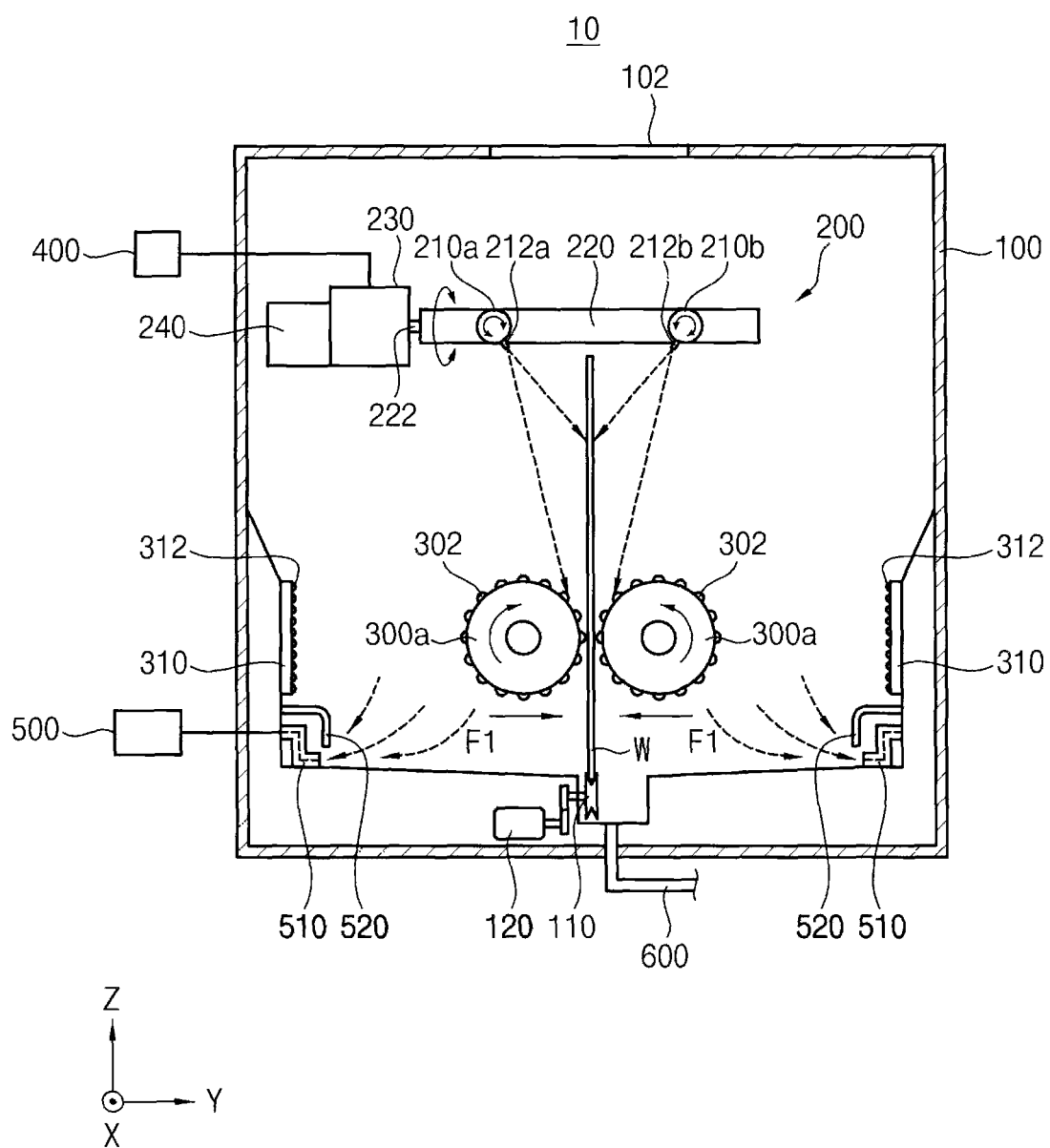
Figure 15:
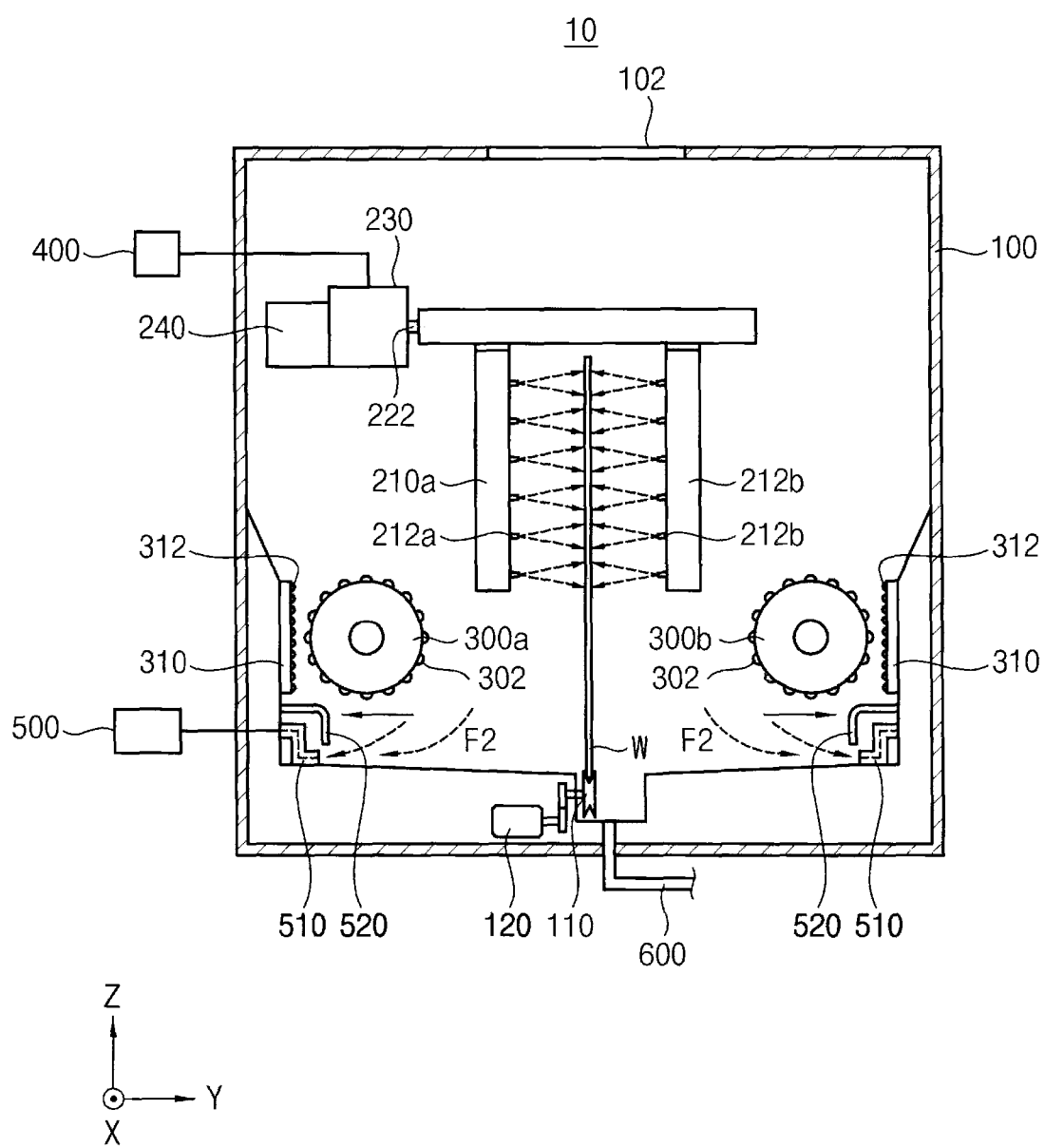
Figure 16:
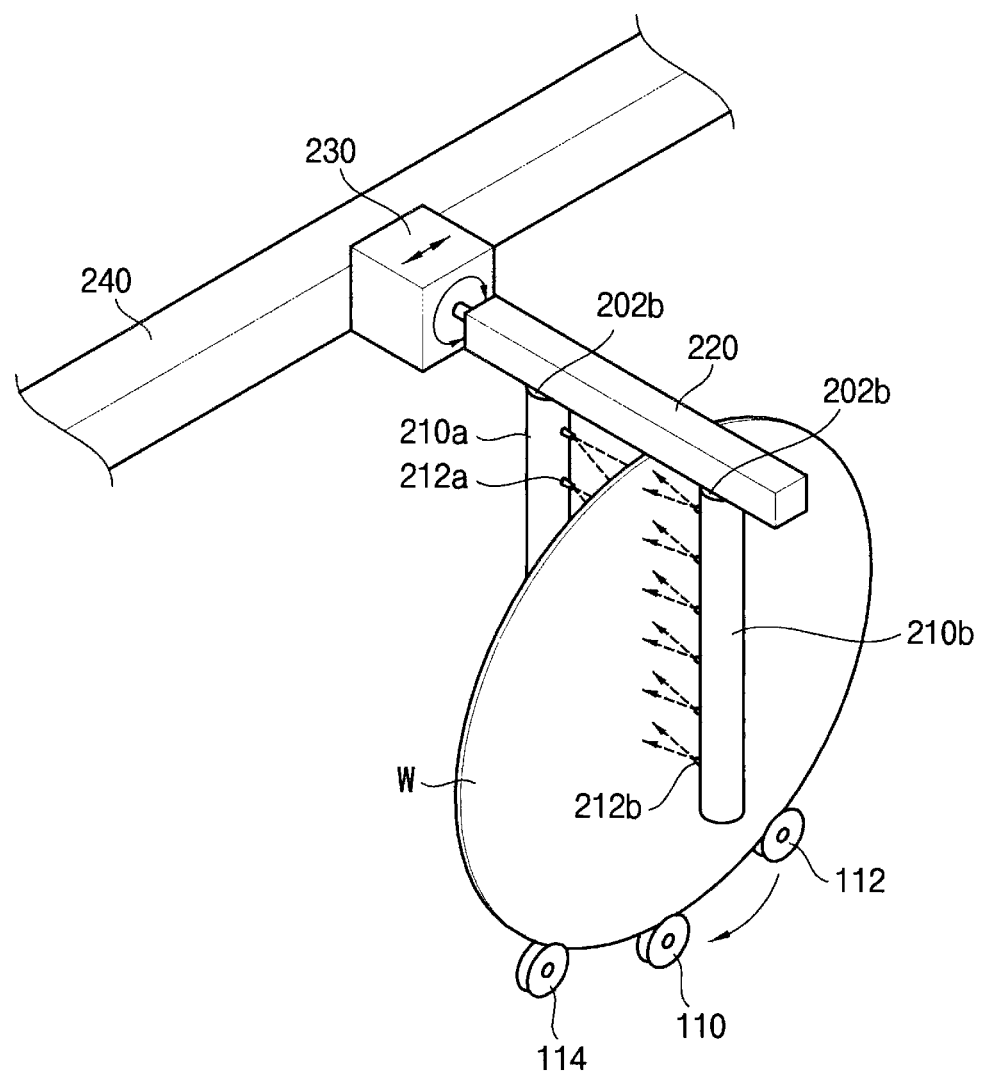

FIGS. 11 to 19B are views illustrating a substrate cleaning method in accordance with exemplary embodiments. FIG. 11 is a cross-sectional view illustrating a substrate cleaning apparatus 10 which performs an aging process on a brush 300a, 300b. FIG. 12 is a perspective view illustrating a portion of the substrate cleaning apparatus 10 in FIG. 11. FIG. 13 is a cross-sectional view illustrating the substrate cleaning apparatus 10 which performs a contact brush cleaning process. FIG. 14 is a perspective view illustrating a portion of the substrate cleaning apparatus 10 in FIG. 13. FIG. 15 is a cross-sectional view illustrating the substrate cleaning apparatus 10 which performs a non-contact brush cleaning process. FIG. 16 is a perspective view illustrating a portion of the substrate cleaning apparatus 10 in FIG. 15. FIGS. 17 to 19B are side views illustrating movements of a nozzle bar 201a, 210b of the substrate cleaning apparatus in FIG. 15.

Referring to FIGS. 11 and 12, before performing a cleaning process on a wafer W, an aging process may be performed on a brush 300a, 300b.

In the exemplary embodiment, after a new brush 300a, 300b is installed in a substrate cleaning apparatus 10, before a cleaning process, an aging process may be performed on cleaning nodules 302 of the brush 300a, 300b.

For example, before the wafer W is loaded into the cleaning bath 100, new brushes 300a and 300b may move to opposite first and second sidewalls of the cleaning bath 100 respectively to contact an aging plate 310 and then rotate on its own axis such that an angled corner of the cleaning nodule 302 may be aged into a round shape.

Nozzles 212a and 212b of a spraying unit 200 may spray a cleaning solution at first and second brushes 300a and 300b to clean particles generated during the aging process. In this case, nozzle bars 210a and 210b may be positioned to be parallel with a longitudinal direction of the brush (X direction), and the nozzle bars 210a and 210b may rotate by a predetermined angle on its own axis to face the brushes 300a and 300b respectively.

Accordingly, prior to a wafer cleaning process in a CMP process, an aging process may be performed on cleaning nodules 302 of a newly installed brush to thereby improve efficiency and productivity of the following wafer cleaning process.

Referring to FIGS. 13 and 14, after the wafer W is loaded into the cleaning bath 100, a contact brush cleaning process may be performed.

In the exemplary embodiments, the contact brush cleaning process may be performed to remove particles generated on surfaces of the wafer W after performing the CMP process. A wafer handler (not illustrated) may load the wafer W into the cleaning bath 100 through a gate 102. The wafer W may be supported by a plurality of rollers 110, 112, 114 of a substrate support. As the rollers rotate, the wafer W may rotate in a direction while being supported by the rollers, 114, 116 and 118.

While the wafer W is supported by the substrate support, first and second brushes 300a and 300b may move to and contact a respective surface of the wafer W, and then rotate about a rotational axis of the respective brush 300a, 300b. At this time, the nozzles 212a and 212b of the spraying unit 200 may spray a cleaning solution to both surfaces $W_f$, $W_s$ of the wafer W and thus perform the contact brush cleaning process. In the exemplary embodiment, the nozzle bars 210a and 210b may be positioned to be parallel with the longitudinal direction of the brush (X direction), and the nozzle bars 210a and 210b may rotate by a predetermined angle to face both surfaces of the wafer W and the brushes 300a and 300b respectively. Additionally, a spraying angle of the nozzle 212a, 212b may be adjusted according to a cleaning process time.

A gas generated during the contact brush cleaning process may be exhausted in a first flow direction (F1) through a suction block 510 of a gas exhaust portion to the outside, and the cleaning solution sprayed out from the nozzle may be exhausted from an exhaust line 600 in a bottom of the cleaning bath 100 to the outside.

Referring to FIGS. 15 to 19B, after the wafer W is loaded into the cleaning bath 100, a non-contact brush cleaning process may be performed.

In exemplary embodiments, the non-contact brush cleaning process may be performed to remove particles generated on the wafer surface after performing the CMP process.

While the wafer W is supported by the substrate support, the first and second brushes 300a and 300b may move away from each other to be spaced apart from the wafer W by a predetermined distance (i.e., positioned at a non-contact position with the wafer W). Then, a pair of the nozzle bars 210a and 210b may rotate, sweep or move in planes parallel with the wafer W while the wafer W is interposed between the nozzle bars 210a and 210b. At this time, the nozzles 212a and 212b may spray a cleaning solution to both surfaces of the wafer W and thus perform the non-contact brush cleaning process.

A gas generated during the non-contact brush cleaning process may be exhausted in a second flow direction (F2) through the suction block 510 of the gas exhaust portion to the outside, and the cleaning solution sprayed out from the nozzle may be exhausted from the exhaust line 600 in the bottom of the cleaning bath 100 to the outside.

Figure 17:
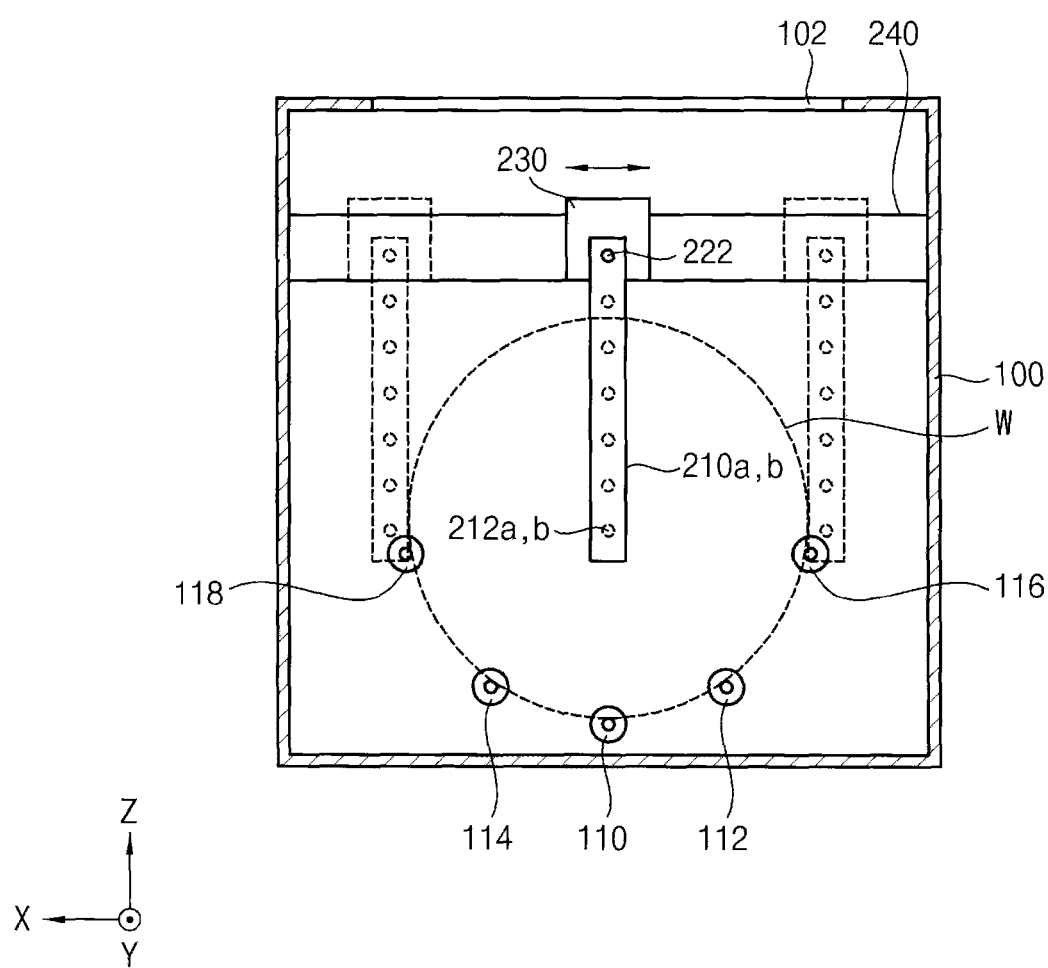

As illustrated in FIG. 17, during the non-contact brush cleaning process, a pair of the nozzle bars 210a and 210b may move in the X direction while the nozzle bars 210a and 210b are positioned parallel with the vertical direction (Z direction).

In particular, a head portion 230 may rotate a connection bar 220 such that the nozzle bars 210a and 210b may be positioned to be parallel with the Z direction, and then, the head portion 230 may move in the X direction along a transfer guide 240. Thus, the nozzle bars 210a and 210b may move in the planes parallel with the wafer W while the wafer W is interposed between the nozzle bars 210a and 210b.

Figure 18:
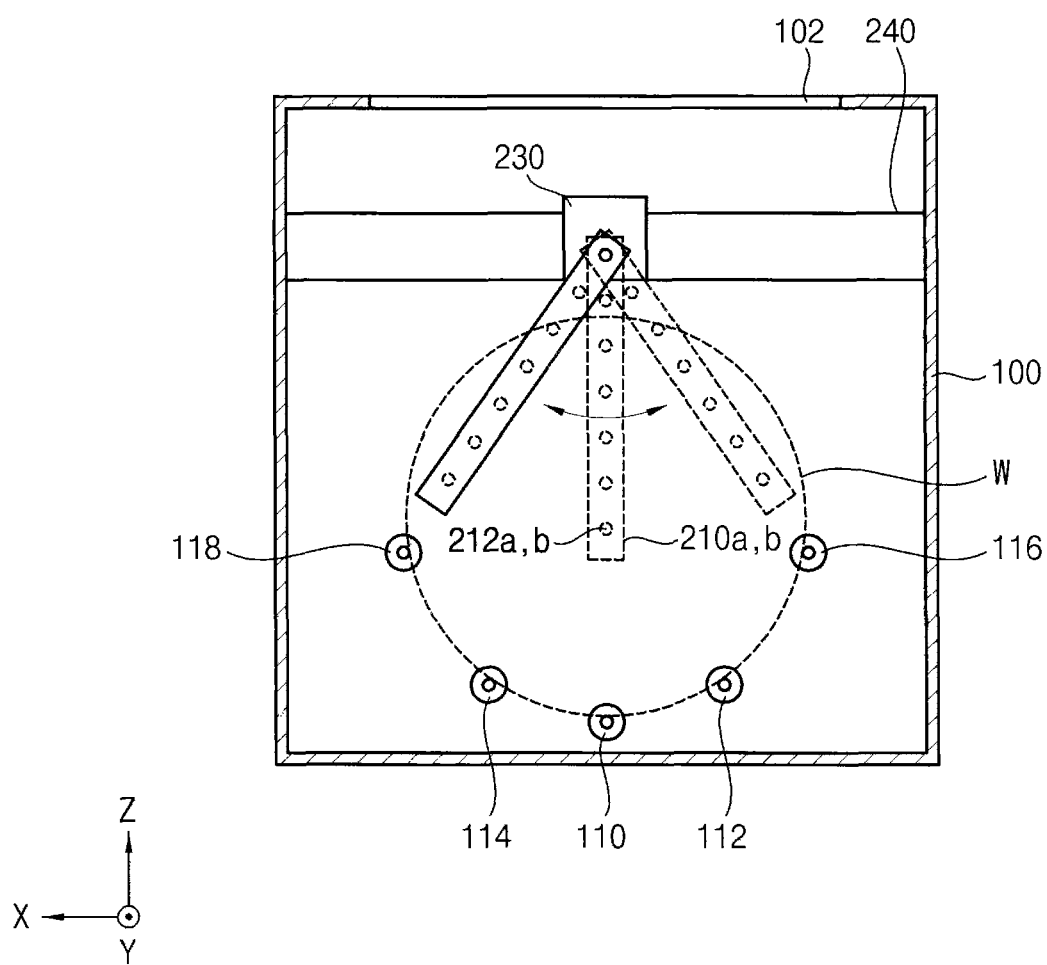

As illustrated in FIG. 18, during the non-contact brush cleaning process, a pair of the nozzle bars 210a and 210b may sweep in left and right directions while the nozzle bars 210a and 210b are positioned parallel with the vertical direction (Z direction) and a center line of the wafer W (center full sweep).

In particular, the head portion 230 may move along the transfer guide 240 and rotate the connection bar 220 such that the nozzle bars 210a and 210b may be positioned to be parallel with the Z direction and the center line of the wafer W, and then, the head portion 230 may rotate the connection bar 220 in left and right directions by a predetermined angle on its own axis. Thus, the nozzle bars 210a and 210b may sweep in the planes parallel with the wafer W while the wafer W is interposed between the nozzle bars 210a and 210b.

Figure 19A:
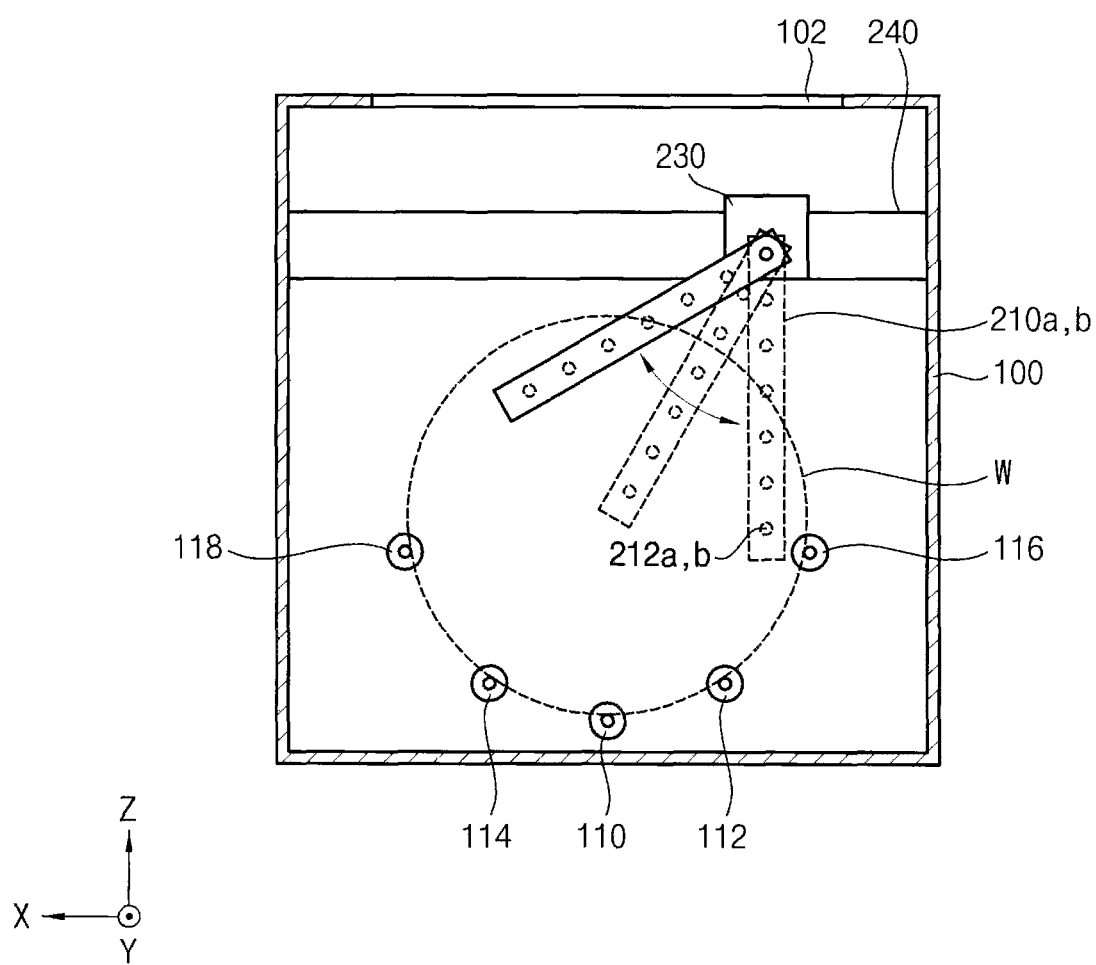
Figure 19B:
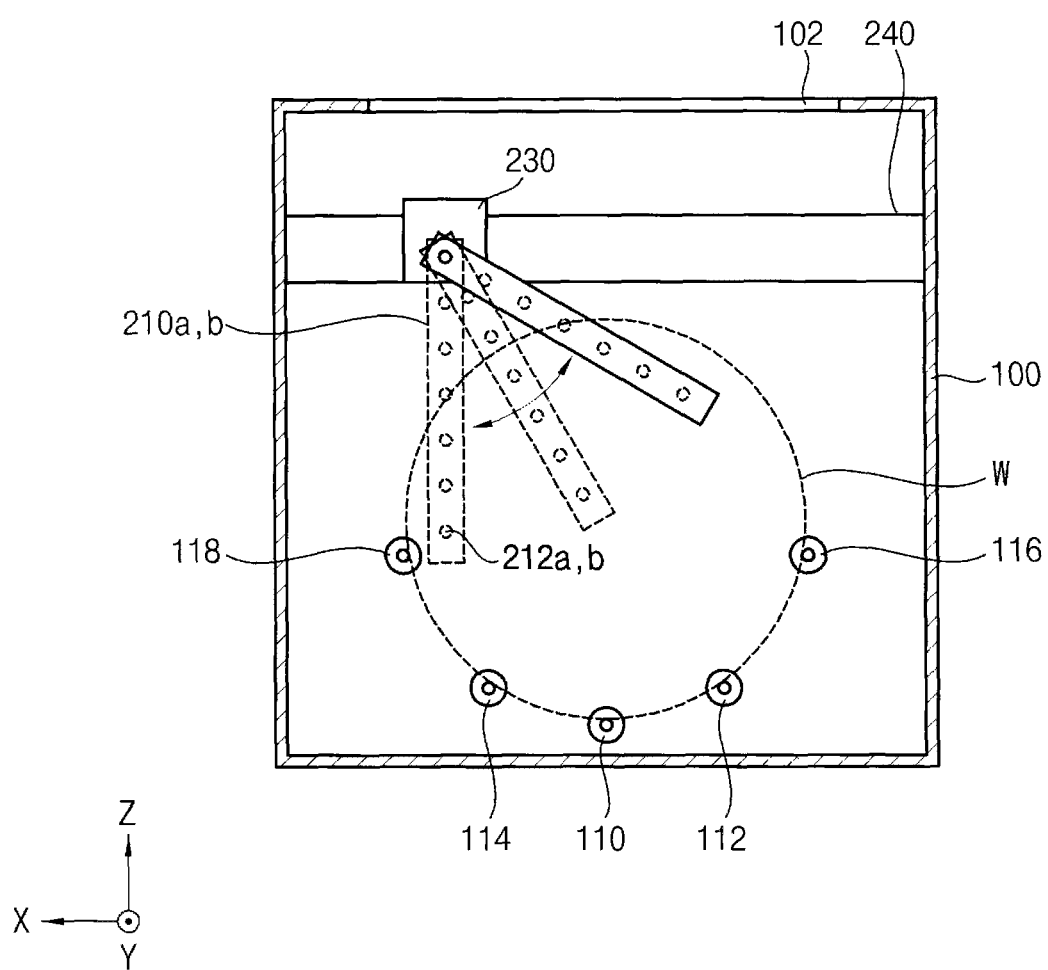

As illustrated in FIGS. 19A and 19B, during the non-contact brush cleaning process, a pair of the nozzle bars 210a and 210b may sweep across an edge of the wafer W while the nozzle bars 210a and 210b are positioned parallel with the vertical direction (Z direction) (edge sweep).

In particular, the head portion 230 may move along the transfer guide 240 and rotate the connection bar 220 such that the nozzle bars 210a and 210b may be positioned to be parallel with the Z direction and across the edge of the wafer W, and then, the head portion 230 may rotate the connection bar 220 reciprocally by a predetermined angle on its own axis. Thus, the nozzle bars 210a and 210b may sweep in the planes parallel with the wafer W while the wafer W is interposed between the nozzle bars 210a and 210b.

In exemplary embodiments, the contact brush cleaning process and the non-contact brush cleaning process may be performed sequentially on the same wafer W. Alternatively, the contact brush cleaning process and the non-contact brush cleaning process may be performed separately on difference wafers W. The cleaning solution used in the contact brush cleaning process may be the same as or different from that used in the non-contact brush cleaning process.

As mentioned above, the substrate cleaning process may include a pair of brushes rotatable on a rotational axis of the brushes and adapted to be in a slidable contact with both surfaces of the wafer, a spraying unit including a pair of nozzle bars adapted to rotate, sweep or move in planes parallel with the wafer with the wafer interposed therebetween and nozzles provided in the nozzle bars respectively to spray a cleaning solution to both surfaces of the wafer, and an aging unit configured to perform an aging process on cleaning nodules of the brush prior to performing a cleaning process.

Accordingly, a contact brush cleaning process and a non-contact cleaning process may be selectively performed to remove particles generated on the wafer surface after performing the CMP process. Further, prior to a wafer cleaning process, an aging process may be performed on cleaning nodules of a newly installed brush to thereby improve efficiency and productivity of the following wafer cleaning process.

The substrate cleaning apparatus may be applied to a CMP process. Semiconductor devices such as DRAM, VNAND, etc manufactured using the CMP process may be used for various systems such as a computing system. The system may be applied to computer, portable computer, laptop computer, PDA, tablet, mobile phone, digital music player, etc.

The foregoing is illustrative of exemplary embodiments and is not to be construed as limiting thereof. Although exemplary embodiments have been particularly shown and described above, those skilled in the art will readily appreciate that various changes may be made therein without materially departing from the inventive concepts as defined by the following claims.

What is claimed is:
1. A substrate cleaning apparatus, comprising:
a cleaning bath comprising a cleaning space configured to accommodate a substrate having a first surface and a second surface opposite to the first surface;
a substrate support configured to support the substrate in the cleaning bath;
a connection bar;
a first nozzle bar and a second nozzle bar, each of the first nozzle bar and the second nozzle bar including a first end and a second end opposite to the first end, the first end of each of the first nozzle bar and the second nozzle bar being pivoted at the connection bar such that the second end of each of the first nozzle bar and the second nozzle bar is rotatable in a plane parallel with the first surface and the second surface of the substrate, each of the first nozzle bar and the second nozzle bar including a passage through which a cleaning solution flows;
a plurality of nozzles provided along a longitudinal direction of each of the first nozzle bar and the second nozzle bar and configured to spray the cleaning solution from the passage of each of the first nozzle bar and the second nozzle bar to the substrate; and
a first brush and a second brush, the first brush provided on a first side of the substrate and configured to clean the first surface and the second brush provided on a second side opposite to the first side of the substrate and configured to clean the second surface of the substrate.

2. The substrate cleaning apparatus of claim 1, wherein the first brush is configured to slidably move toward or away from the substrate, and
wherein the second brush is configured to slidably move toward or away from the substrate.

3. The substrate cleaning apparatus of claim 1, wherein each of the first nozzle bar and the second nozzle bar is configured to rotate about a respective end portion of each nozzle bar between a first position on the plane and a second position on the plane, each of the first nozzle bar and the second nozzle bar extending in a first direction at the first position and each of the first nozzle bar and the second nozzle bar extending in a second direction perpendicular to the first direction in the cleaning bath.

4. The substrate cleaning apparatus of claim 1, further comprising a head portion configured to rotate the connection bar about a longitudinal axis of the connection bar,
wherein the connection bar comprises a connection passage connected to with the passage of each of the first nozzle bar and the second nozzle bar; and
wherein the head portion is configured to supply the cleaning solution to the connection passage.

5. The substrate cleaning apparatus of claim 4, wherein the head portion comprises:
a drive shaft fixed to the connection bar to rotate with the connection bar; and
a drive shaft driving unit configured to the rotate the drive shaft on an axis of the drive shaft.

6. The substrate cleaning apparatus of claim 5, wherein the head portion further comprises a rotary union configured to guide the cleaning solution to flow into a fluid passage formed through the drive shaft.

7. The substrate cleaning apparatus of claim 5, wherein the head portion further comprises an outer connection tube connected to the connection passage in the connection bar and configured to supply the cleaning solution.

8. The substrate cleaning apparatus of claim 1, wherein each of the first nozzle bar and the second nozzle bar is configured to rotate about an longitudinal axis of each of the first nozzle bar and the second nozzle bar to adjust a spraying angle of the nozzle.

9. The substrate cleaning apparatus of claim 1, wherein the substrate support comprises a plurality of rollers configured to support and to rotate the substrate.

10. The substrate cleaning apparatus of claim 1, further comprising an aging plate provided in the cleaning bath and configured to age cleaning nodules of each of the first brush and the second brush.

11. The substrate cleaning apparatus of claim 10, wherein the aging plate comprises a plurality of aging protrusions provided on the aging plate.

12. The substrate cleaning apparatus of claim 11, wherein the aging plate further comprises a flow guide pathway provided between the plurality of aging protrusions which extend in a direction parallel with a vertical direction of the cleaning bath.

13. The substrate cleaning apparatus of claim 10, wherein the aging plate is provided on an inner wall of the cleaning bath.

14. The substrate cleaning apparatus of claim 1, further comprising a gas exhaust portion configured to exhaust a gas generated from the cleaning bath to an exterior of the substrate cleaning apparatus.

15. A substrate cleaning apparatus, comprising:
a cleaning bath comprising a cleaning space configured to accommodate a substrate in a first direction;
a substrate support configured to support the substrate in the first direction in the cleaning bath;
a spraying unit configured to spray a cleaning solution at a first surface and a second surface of the substrate in the cleaning bath;
a pair of brushes movable in a second direction perpendicular to the first direction with respect to the substrate and configured to clean the first surface and the second surface of the substrate via contact; and
an aging plate provided in the cleaning bath and configured to age cleaning nodules of the pair of brushes.

16. The substrate cleaning apparatus of claim 15, wherein the spraying unit comprises:
a pair of nozzle bars configured to be rotatable in planes parallel with the substrate, each of the pair of nozzle bars comprising a passage through which a cleaning solution flows; and
a plurality of nozzles provided along a longitudinal direction of each of the pair of nozzle bars and configured to be in communication with the passage to spray the cleaning solution to the substrate.

17. The substrate cleaning apparatus of claim 16, wherein each nozzle bar of the pair of nozzle bars is configured to rotate about an end portion of the nozzle bar between a first position and a second position, each nozzle bar extending in a first direction at the first position and each nozzle bar extending in a second direction perpendicular to the first direction in the cleaning bath.

18. The substrate cleaning apparatus of claim 17, further comprising:
a connection bar connected to an end portion of each nozzle bar and comprising a connection passage connected to with the passage of each of the pair of nozzle bars; and a head portion configured to rotate the connection bar about a longitudinal axis of the connection bar and to supply the cleaning solution to the connection passage.

19. The substrate cleaning apparatus of claim 15, wherein the aging plate comprises a plurality of aging protrusions provided on the aging plate.

20. A substrate cleaning apparatus, comprising:
a cleaning bath configured to accommodate a substrate having a first surface and a second surface opposite to the first surface, the cleaning bath comprising a first sidewall and a second sidewall provided opposite to the first sidewall;
a substrate support configured to support the substrate in the cleaning bath;
a connection bar configured to be rotated along a longitudinal axis of the connection bar;
a first nozzle bar provided between the first sidewall and the first surface, pivoted at the connection bar and configured to be rotated together with the connection bar;
a second nozzle bar provided between the second sidewall and the second surface, pivoted at the connection bar and configured to be rotated together with the connection bar, each of the first nozzle bar and the second nozzle bar comprising:
a passage through which a cleaning solution flows; and
a plurality of nozzles provided along a longitudinal direction of each of the first nozzle bar and the second nozzle bar and configured to spray the cleaning solution from the passage of each of the first nozzle bar and the second nozzle bar to the substrate; and
a first brush configured to move between the first sidewall and the first surface and to contact clean the first surface; and
a second brush configured to move between the second sidewall and the second surface and contact clean the second surface.

* * * * *